United States Patent
Cheng et al.

(10) Patent No.: US 11,639,958 B2
(45) Date of Patent: May 2, 2023

(54) VOLTAGE TRACKING CIRCUIT AND METHOD OF OPERATING THE SAME

(71) Applicant: TAIWAN SEMICONDUCTOR MANUFACTURING CO., LTD., Hsinchu (TW)

(72) Inventors: Hsiang-Hui Cheng, Hsinchu (TW); Chia-Jung Chang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 17/816,064

(22) Filed: Jul. 29, 2022

(65) Prior Publication Data

US 2022/0365130 A1 Nov. 17, 2022

Related U.S. Application Data

(63) Continuation of application No. 17/030,062, filed on Sep. 23, 2020, now Pat. No. 11,454,668.
(Continued)

(51) Int. Cl.
*G01R 31/28* (2006.01)
*H01L 27/02* (2006.01)

(52) U.S. Cl.
CPC ...... *G01R 31/2879* (2013.01); *H01L 27/0285* (2013.01)

(58) Field of Classification Search
CPC ............ G01R 31/2621; G01R 31/2623; G01R 31/2625; G01R 31/2626; G01R 31/2628
See application file for complete search history.

(56) References Cited

U.S. PATENT DOCUMENTS

| | | | | |
|---|---|---|---|---|
| 6,025,621 A | * | 2/2000 | Lee | H01L 27/108 257/299 |
| 6,750,527 B1 | * | 6/2004 | Momohara | H01L 27/105 257/500 |

(Continued)

FOREIGN PATENT DOCUMENTS

| | | |
|---|---|---|
| JP | 2013539249 | 10/2013 |
| KR | 20020002701 | 1/2002 |

(Continued)

OTHER PUBLICATIONS

Office Action dated Jun. 15, 2022 for corresponding case No. KR 10-2020-0183772. English translation attached on p. 1. (pp. 1-6).
(Continued)

*Primary Examiner* — Tung X Nguyen
(74) *Attorney, Agent, or Firm* — Hauptman Ham, LLP

(57) ABSTRACT

A voltage tracking circuit includes first, second, third and fourth transistors. The first transistor is in a first well, and includes a first gate, a first drain and a first source coupled to a first voltage supply. The second transistor includes a second gate, a second drain and a second source. The second source is coupled to the first drain. The second gate is coupled to the first gate and the pad voltage terminal. The third transistor includes a third gate, a third drain and a third source. The fourth transistor includes a fourth gate, a fourth drain and a fourth source. The fourth drain is coupled to the third source. The fourth source is coupled to the pad voltage terminal. The fourth transistor is in a second well different from the first well, and is separated from the first well in a first direction.

20 Claims, 16 Drawing Sheets

Related U.S. Application Data

(60) Provisional application No. 62/954,924, filed on Dec. 30, 2019.

(56) References Cited

U.S. PATENT DOCUMENTS

| | | |
|---|---|---|
| 8,228,109 B2 | 7/2012 | Stockinger et al. |
| 2012/0176710 A1 | 7/2012 | Domanski et al. |
| 2013/0155557 A1 | 6/2013 | Ojala et al. |
| 2019/0164959 A1 | 5/2019 | Chang et al. |

FOREIGN PATENT DOCUMENTS

| | | |
|---|---|---|
| KR | 20180062342 | 6/2018 |
| TW | 200541041 | 12/2005 |

OTHER PUBLICATIONS

Notice of Allowance dated Jun. 7, 2021 from corresponding application No. TW 11020539080 (pp. 1-4).

\* cited by examiner

VOLTAGE TRACKING CIRCUIT AND METHOD OF OPERATING THE SAME

PRIORITY CLAIM AND CROSS-REFERENCE

The present application is a continuation of U.S. application Ser. No. 17/030,062, filed Sep. 23, 2020, now U.S. Pat. No. 11,454,668, issued Sep. 27, 2022, which claims the benefit of U.S. Provisional Application No. 62/954,924, filed Dec. 30, 2019, which are herein incorporated by reference in their entireties.

BACKGROUND

The recent trend in miniaturizing integrated circuits (ICs) has resulted in smaller devices which consume less power, yet provide more functionally at higher speeds than before. The miniaturization process has also increased the devices' susceptibility to electrostatic discharge (ESD) events due to various factors, such as thinner dielectric thicknesses and associated lowered dielectric breakdown voltages. ESD is one of the causes of electronic circuit damage and is also one of the considerations in semiconductor advanced technology.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
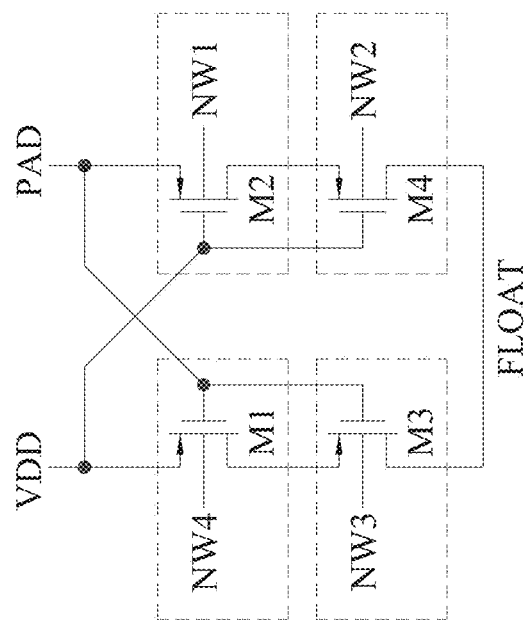
FIG. 1A is a schematic diagram of an integrated circuit, in accordance with some embodiments.

The following disclosure provides different embodiments, or examples, for implementing features of the provided subject matter. Specific examples of components, materials, values, steps, arrangements, or the like, are described below to simplify the present disclosure. These are, of course, merely examples and are not limiting. Other components, materials, values, steps, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, a voltage tracking circuit includes a first transistor, a second transistor, a third transistor and a fourth transistor. In some embodiments, the first transistor and second transistor are coupled to each other in a stacked structure, and the third transistor and the fourth transistor are coupled to each other in another stacked structure.

In some embodiments, each of a first gate terminal of the first transistor, a third gate terminal of the third transistor and a pad voltage terminal are coupled to each other, and configured to receive a pad voltage. In some embodiments, each of a second gate terminal of the second transistor, a fourth gate terminal of the fourth transistor and a first voltage supply are coupled to each other, and configured to receive a supply voltage.

In some embodiments, the first transistor is in a first well, and at least the third transistor is in a second well different from the first well. In some embodiments, the second well is separated from the first well in a first direction.

In some embodiments, by positioning at least the first transistor and the third transistor in corresponding separate wells, the voltage tracking circuit has better ESD immunity and occupies less area than other approaches.

Integrated Circuit

FIG. 1A is a schematic diagram of an integrated circuit 100A, in accordance with some embodiments.

Integrated circuit 100A comprises P-type Metal Oxide Semiconductor (PMOS) transistors M1, M2, M3 and M4 coupled to a voltage supply VDD and a pad terminal PAD. In some embodiments, integrated circuit 100A corresponds to a pad voltage tracking circuit configured to track a voltage from the pad terminal PAD. In some embodiments, the pad terminal PAD corresponds to an input/output (IO) pad, a voltage supply pad (e.g., VDD), a reference voltage supply (e.g., VSS), or the like.

Each PMOS transistor M1, M2, M3 and M4 is positioned in a corresponding well NW4, NW1, NW3 and NW2. For example, PMOS transistor M1 is positioned in a well NW4, PMOS transistor M2 is positioned in a well NW1, PMOS transistor M3 is positioned in a well NW3, and PMOS transistor M4 is positioned in a well NW2. At least well NW4, NW1, NW3 or NW2 includes an n-type dopant impurity, and is referred to as an N-Well. In some embodiments, at least well NW4, NW1, NW3 or NW2 includes a p-type dopant impurity, and is referred to as a P-Well.

PMOS transistor M1 is positioned in the well NW4. PMOS transistor M1 includes a gate terminal, a drain terminal, a source terminal, and a body terminal. The source terminal of PMOS transistor M1 is coupled to at least the first voltage supply VDD. The gate terminal of PMOS transistor M1 is coupled to at least the pad terminal PAD and is configured to receive a pad voltage (not labelled). The body terminal of PMOS transistor M1 is coupled to the well NW4.

PMOS transistor M2 is positioned in the well NW1. PMOS transistor M2 includes a gate terminal, a drain terminal, a source terminal, and a body terminal. The source terminal of PMOS transistor M2 is coupled to at least the pad terminal PAD and is configured to receive a pad voltage (not labelled). The gate terminal of PMOS transistor M2 is coupled to at least the voltage supply VDD, and is configured to receive the supply voltage (not labelled). The body terminal of PMOS transistor M2 is coupled to the well NW1.

PMOS transistor M3 is positioned in the well NW4. PMOS transistor M1 includes a gate terminal, a drain terminal, a source terminal, and a body terminal. The source terminal of PMOS transistor M3 is coupled to the drain terminal of PMOS transistor M1. Each of the gate terminal of PMOS transistor M3, the gate terminal of PMOS transistor M1 and the source terminal of PMOS transistor M2 are coupled together, and are also coupled to the pad terminal PAD. The gate terminal of PMOS transistor M3 and the gate terminal of PMOS transistor M1 are configured to receive the pad voltage (not labelled) from the pad terminal PAD. The body terminal of PMOS transistor M3 is coupled to the well NW3.

PMOS transistor M4 is positioned in the well NW2. PMOS transistor M4 includes a gate terminal, a drain terminal, a source terminal, and a body terminal. The source terminal of PMOS transistor M4 is coupled to the drain terminal of PMOS transistor M2. The drain terminal of PMOS transistor M4 and the drain terminal of PMOS transistor M3 are coupled together, and are electrically floating. Each of the gate terminal of PMOS transistor M2, the gate terminal of PMOS transistor M4 and the source terminal of PMOS transistor M1 are coupled together, and are also coupled to the voltage supply VDD. The gate terminal of PMOS transistor M4 and the gate terminal of PMOS transistor M2 are configured to receive the supply voltage (not labelled) from the voltage supply VDD. The body terminal of PMOS transistor M4 is coupled to the well NW2.

Other transistor types or other numbers of transistors in at least integrated circuit 100A-100B (FIG. 1B), 200A-200B (FIGS. 2A-2B), 300A-300C (FIGS. 3A-3C), 400A-400C (FIGS. 4A-4C), 500A-500C (FIGS. 5A-5C), 600A-600C (FIGS. 6A-6C) or 700A-700D (FIGS. 7A-7D) are within the scope of the present disclosure.

In some embodiments, by positioning PMOS transistors M1, M2, M3 and M4 in corresponding separate wells NW4, NW1, NW3 and NW2, integrated circuit 100A-100B has better ESD immunity and occupies less area than other approaches.

Figure 1B:
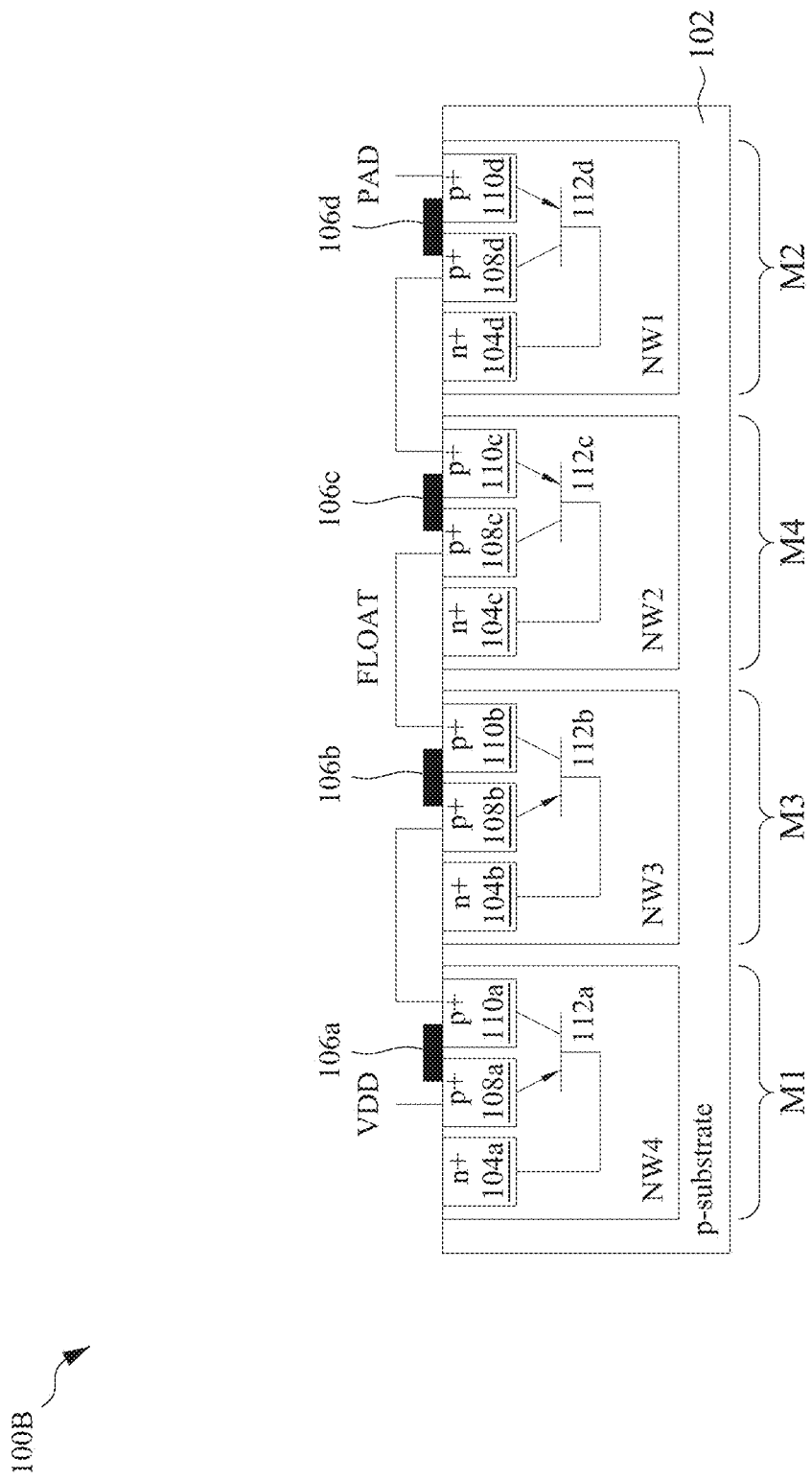
FIG. 1B is a cross-sectional view of integrated circuit, in accordance with some embodiments.

FIG. 1B is a cross-sectional view of integrated circuit 100B, in accordance with some embodiments. Integrated circuit 100B is an embodiment of integrated circuit 100A.

Components that are the same or similar to those in one or more of FIGS. 1A-1B and 2A-8 (shown below) are given the same reference numbers, and detailed description thereof is thus omitted.

Integrated circuit 100B comprises a substrate 102. In some embodiments, substrate 102 is a p-type substrate. In some embodiments, substrate 102 is an n-type substrate. In some embodiments, substrate 102 includes an elemental semiconductor including silicon or germanium in crystal, polycrystalline, or an amorphous structure; a compound semiconductor including silicon carbide, gallium arsenic, gallium phosphide, indium phosphide, indium arsenide, and indium antimonide; an alloy semiconductor including SiGe, GaAsP, AlInAs, AlGaAs, GaInAs, GaInP, and GaInAsP; another suitable material; or combinations thereof. In some embodiments, the alloy semiconductor substrate has a gradient SiGe feature in which the Si and Ge composition change from one ratio at one location to another ratio at another location of the gradient SiGe feature. In some embodiments, the alloy SiGe is formed over a silicon substrate. In some embodiments, first substrate 102 is a strained SiGe substrate. In some embodiments, the semiconductor substrate has a semiconductor on insulator structure, such as a silicon on insulator (SOI) structure. In some embodiments, the semiconductor substrate includes a doped epi layer or a buried layer. In some embodiments, the compound semiconductor substrate has a multilayer structure, or the substrate includes a multilayer compound semiconductor structure.

Integrated circuit 100B further comprises wells NW1, NW2, NW3 and NW4 in substrate 102. In some embodiments, at least well NW1, NW2, NW3 or NW4 includes a dopant impurity type opposite of the substrate type. In some embodiments, at least well NW1, NW2, NW3 or NW4 includes an n-type dopant impurity, and substrate is a p-type substrate. In some embodiments, at least well NW1, NW2, NW3 or NW4 includes a p-type dopant impurity, and substrate is an n-type substrate.

At least well NW1, NW2, NW3 or NW4 extends in a first direction X. Each of wells NW1, NW2, NW3 or NW4 is separated from another of wells NW1, NW2, NW3 or NW4 in the first direction X. In some embodiments, at least well NW4, NW3, NW2 or NW1 is referred to as a body of corresponding PMOS transistor M1, M3, M4 or M2.

Integrated circuit 100B further comprises regions 104a, 104b, 104c and 104d. Region 104a, 104b, 104c or 104d is within corresponding well NW4, NW3, NW2 or NW1. In some embodiments, at least region 104a, 104b, 104c or 104d includes an n-type dopant impurity. In some embodiments, at least region 104a, 104b, 104c or 104d includes a p-type dopant impurity. In some embodiments, region 104a, 104b, 104c or 104d is connected to a corresponding body terminal of corresponding PMOS transistor M1, M3, M4 or M2.

Integrated circuit 100B further comprises gates 106a, 106b, 106c and 106d. Gate 106a, 106b, 106c or 106d is above corresponding well NW4, NW3, NW2 or NW1. In some embodiments, gate 106a, 106b, 106c or 106d is a corresponding gate of corresponding PMOS transistor M1, M3, M4 or M2. For ease of illustration, gates 106a and 106b are not shown as being coupled to each other or other elements, and gates 106c and 106d are not shown as being coupled to each other or other elements.

Integrated circuit 100B further comprises implant regions 108a, 108b, 108c and 108d. Implant region 108a, 108b, 108c or 108d is within corresponding well NW4, NW3, NW2 or NW1. In some embodiments, at least implant region 108a, 108b, 108c or 108d includes a dopant impurity type opposite of the dopant impurity type in the corresponding well NW4, NW3, NW2 or NW1. In some embodiments, at least implant region 108a, 108b, 108c or 108d includes a p-type dopant impurity. In some embodiments, at least implant region 108a, 108b, 108c or 108d includes an n-type dopant impurity. In some embodiments, implant region 108a or 108b is the corresponding source terminal of corresponding PMOS transistor M1 or M3. In some embodiments, implant region 108c or 108d is the corresponding drain terminal of corresponding PMOS transistor M4 or M2.

Integrated circuit 100B further comprises implant regions 110a, 110b, 110c and 110d. Implant region 110a, 110b, 110c or 110d is within corresponding well NW4, NW3, NW2 or NW1. In some embodiments, at least implant region 110a, 110b, 110c or 110d includes a dopant impurity type opposite of the dopant impurity type in the corresponding well NW4, NW3, NW2 or NW1. In some embodiments, at least implant region 110a, 110b, 110c or 110d includes a p-type dopant impurity. In some embodiments, at least implant region 110a, 110b, 110c or 110d includes an n-type dopant impurity. In some embodiments, implant region 110a or 110b is the corresponding drain terminal of corresponding PMOS transistor M1 or M3. In some embodiments, implant region 110c or 110d is the corresponding source terminal of corresponding PMOS transistor M4 or M2.

Implant region 110a is electrically coupled to implant region 108b and corresponds to the connection between the drain terminal of PMOS transistor M1 and the source terminal of PMOS transistor M3 of FIG. 1A. Implant region 110b is electrically coupled to implant region 108c and corresponds to the connection between the drain terminal of PMOS transistor M3 and the drain terminal of PMOS transistor M4 of FIG. 1A. Implant region 110c is electrically coupled to implant region 108d and corresponds to the connection between the drain terminal of PMOS transistor M2 and the source terminal of PMOS transistor M4 of FIG. 1A.

A parasitic pnp transistor 112a, 112b, 112c or 112d is formed by corresponding well NW4, NW3, NW2 or NW1, corresponding implant region 108a, 108b, 108c or 108d and corresponding implant region 110a, 110b, 110c or 110d. For example, the well NW4 forms a base of parasitic pnp transistor 112a, the implant region 108a forms an emitter of parasitic pnp transistor 112a and region 110a forms a collector of parasitic pnp transistor 112a. Similarly, the well NW3 forms a base of parasitic pnp transistor 112b, the implant region 108b forms an emitter of parasitic pnp transistor 112b and region 110b forms a collector of parasitic pnp transistor 112a. Similarly, the well NW2 forms a base of parasitic pnp transistor 112c, the implant region 108c forms a collector of parasitic pnp transistor 112c and region 110c forms an emitter of parasitic pnp transistor 112a. Similarly, the well NW1 forms a base of parasitic pnp transistor 112d, the implant region 108d forms a collector of parasitic pnp transistor 112d and region 110d forms an emitter of parasitic pnp transistor 112d. In some embodiments, at least parasitic pnp transistor 112a, 112b, 112c or 112d is a parasitic bipolar junction transistor (BJT).

In some embodiments, at least parasitic pnp transistor 112a, 112b, 112c or 112d is configured to provide a current path for an ESD event. In some embodiments, the ESD event corresponds to a voltage of the pad terminal PAD being greater than a voltage of the supply voltage VDD. In some embodiments, at least parasitic pnp transistor 112a, 112b, 112c or 112d is configured to block a current path for the ESD event.

In some embodiments, by positioning PMOS transistors M1, M2, M3 and M4 in corresponding separate wells NW4, NW1, NW3 and NW2, integrated circuit 100B has better ESD immunity and occupies less area than other approaches.

Figure 2A:
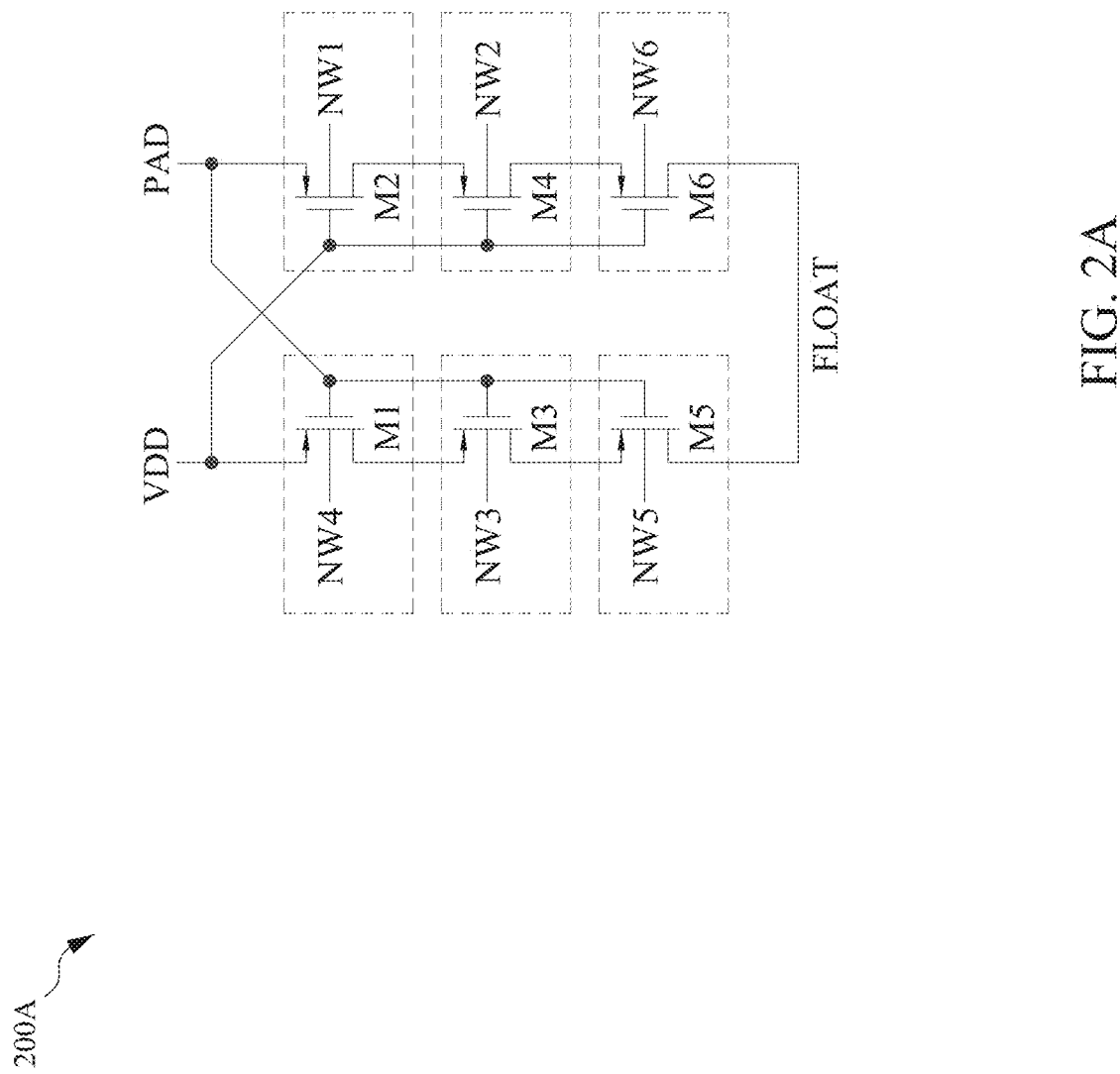
FIG. 2A is a schematic diagram of an integrated circuit, in accordance with some embodiments.

FIG. 2A is a schematic diagram of an integrated circuit 200A, in accordance with some embodiments. Integrated circuit 200A is a variation of integrated circuit 100A, and similar detailed description is therefore omitted. For example, integrated circuit 200A illustrates an example of where additional PMOS transistors M5 and M6 are utilized in the stacked PMOS configuration of the PAD voltage tracking circuit.

In comparison with integrated circuit 100A of FIG. 1A, integrated circuit 200A further includes PMOS transistors M5 and M6 and corresponding wells NW5 and NW6.

PMOS transistor M5 or M6 is positioned in corresponding well NW5 or NW6. For example, PMOS transistor M5 is positioned in a well NW5, and PMOS transistor M6 is positioned in a well NW6. At least well NW5 or NW6 includes an n-type dopant impurity. In some embodiments, at least well NW5 or NW6 includes a p-type dopant impurity.

PMOS transistor M5 includes a gate terminal, a drain terminal, a source terminal, and a body terminal. The source terminal of PMOS transistor M5 is coupled to the drain terminal of PMOS transistor M3 in FIG. 2A. Each of the gate terminal of PMOS transistor M5, the gate terminal of PMOS transistor M1, the gate terminal of PMOS transistor M3 and the source terminal of PMOS transistor M2 are coupled together in FIG. 2A, and are also coupled to the pad terminal PAD. The gate terminal of PMOS transistor M5 is configured to receive the pad voltage (not labelled) from the pad terminal PAD. The body terminal of PMOS transistor M5 is coupled to the well NW5.

PMOS transistor M6 includes a gate terminal, a drain terminal, a source terminal, and a body terminal. The source terminal of PMOS transistor M6 is coupled to the drain terminal of PMOS transistor M4 in FIG. 2A. The drain terminal of PMOS transistor M6 and the drain terminal of PMOS transistor M5 are coupled together, and are electrically floating. Each of the gate terminal of PMOS transistor M6, the gate terminal of PMOS transistor M2, the gate terminal of PMOS transistor M4 and the source terminal of PMOS transistor M1 are coupled together in FIG. 2A, and are also coupled to the voltage supply VDD. The gate terminal of PMOS transistor M6 is configured to receive the supply voltage (not labelled) from the voltage supply VDD. The body terminal of PMOS transistor M6 is coupled to the well NW6.

In some embodiments, by positioning PMOS transistors M1, M2, M3, M4, M5 and M6 in corresponding separate wells NW4, NW1, NW3, NW2, NW5 and NW6, integrated circuit 200A-200B has better ESD immunity and occupies less area than other approaches.

Figure 2B:
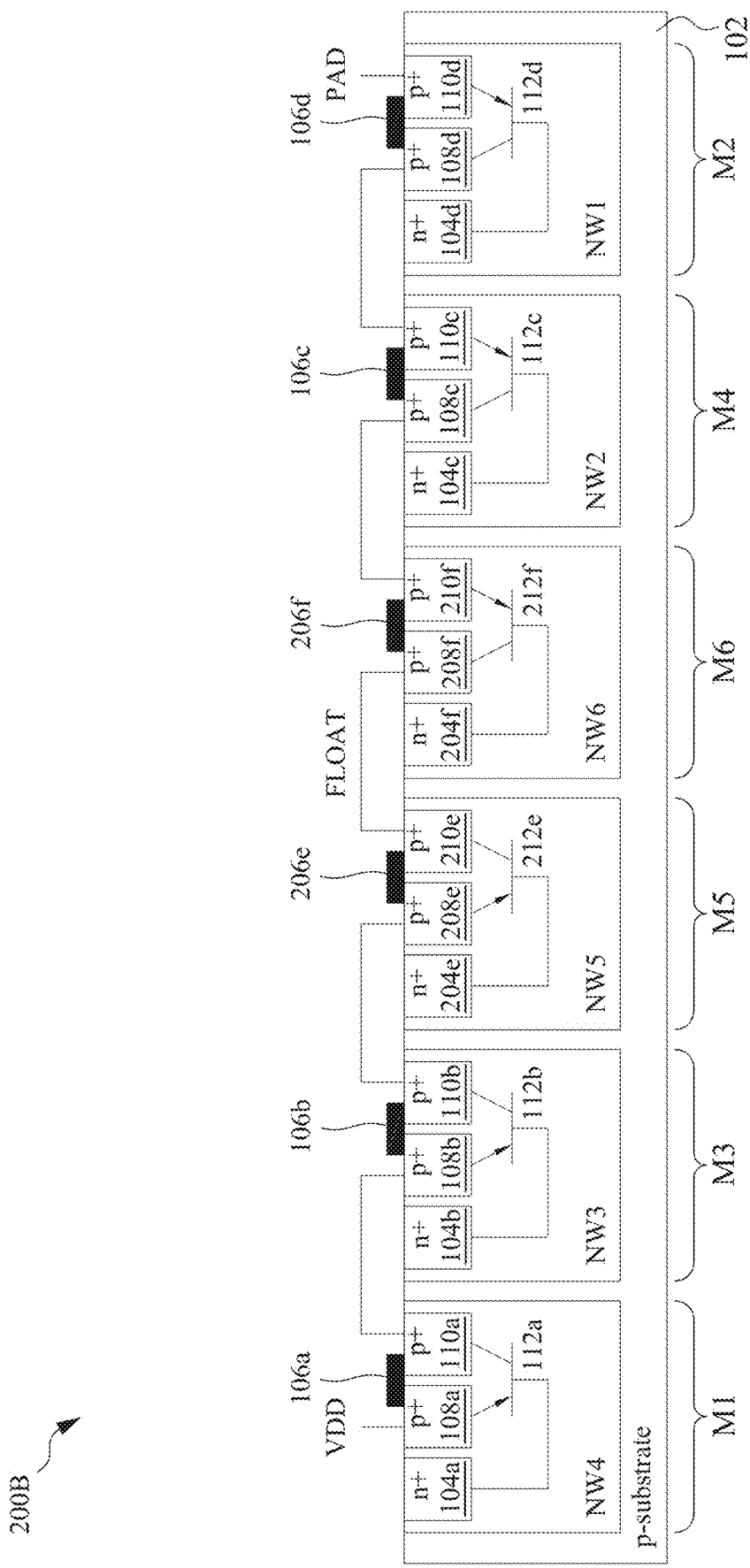
FIG. 2B is a cross-sectional view of integrated circuit, in accordance with some embodiments.

FIG. 2B is a cross-sectional view of integrated circuit 200B, in accordance with some embodiments. Integrated circuit 200B is an embodiment of integrated circuit 200A.

Integrated circuit 200B is a variation of integrated circuit 100B, and similar detailed description is therefore omitted. For example, integrated circuit 100B illustrates an example of where additional PMOS transistors M5 and M6 are utilized in the stacked PMOS configuration of the PAD voltage tracking circuit (e.g., integrated circuit 100A of FIG. 1A).

In comparison with integrated circuit 100B of FIG. 1B, integrated circuit 200B further includes PMOS transistors M5 and M6 in corresponding wells NW5 and NW6.

In comparison with integrated circuit 100B of FIG. 1B, integrated circuit 200B further includes wells NW5 and NW6, regions 204e and 204f, gates 206e and 206f, implant regions 208e and 208f, and implant regions 210e and 210f.

Wells NW5 and NW6 are in substrate 102. In some embodiments, at least well NW5 or NW6 includes a dopant impurity type opposite of the substrate type. In some embodiments, at least well NW5 or NW6 includes an n-type dopant impurity, and substrate is a p-type substrate. In some embodiments, at least well NW5 or NW6 includes a p-type dopant impurity, and substrate is an n-type substrate.

At least well NW5 or NW6 extends in a first direction X. Each of wells NW1, NW2, NW3, NW4, NW5 or NW6 is separated from another of wells NW1, NW2, NW3, NW4, NW5 or NW6 in the first direction X. In some embodiments, at least well NW5 or NW6 is referred to as a body of corresponding PMOS transistor M5 or M6.

Region 204e or 204f is within corresponding well NW5 or NW6. In some embodiments, at least region 204e or 204f includes an n-type dopant impurity. In some embodiments, at least region 204e or 204f includes a p-type dopant impurity. In some embodiments, region 204e or 204f is connected to a corresponding body terminal of corresponding PMOS transistor M5 or M6.

Gate 206e or 206f is above corresponding well NW5 or NW6. In some embodiments, gate 206e or 206f is a corresponding gate of corresponding PMOS transistor M5 or M6. For ease of illustration, gates 106a, 106b and 206e are not shown as being coupled to each other or other elements, and gates 106c, 106d and 206f are not shown as being coupled to each other or other elements.

Implant region 208e or 208f is within corresponding well NW5 or NW6. In some embodiments, at least implant region 208e or 208f includes a dopant impurity type opposite of the dopant impurity type in the corresponding well NW5 or NW6. In some embodiments, at least implant region 208e or 208f includes a p-type dopant impurity. In some embodiments, at least implant region 208e or 208f includes an n-type dopant impurity. In some embodiments, implant region 208e is the source terminal of PMOS transistor M5. In some embodiments, implant region 208f is the drain terminal of PMOS transistor M6.

Implant region 210e or 210f is within corresponding NW5 or NW6. In some embodiments, at least implant region 210e or 210f includes a dopant impurity type opposite of the dopant impurity type in the corresponding well NW5 or NW6. In some embodiments, at least implant region 210e or 210f includes a p-type dopant impurity. In some embodiments, at least implant region 210e or 210f includes an n-type dopant impurity. In some embodiments, implant region 210e is the drain terminal of PMOS transistor M5. In some embodiments, implant region 210f is the source terminal of PMOS transistor M6.

In comparison with integrated circuit 100B of FIG. 1B, implant region 110b of FIG. 2B is not electrically coupled to implant region 108c.

Implant region 110b of FIG. 2B is electrically coupled to implant region 208e, and corresponds to the connection between the drain terminal of PMOS transistor M3 and the source terminal of PMOS transistor M5 of FIG. 2A. Implant region 108c of FIG. 2B is electrically coupled to implant region 210f, and corresponds to the connection between the drain terminal of PMOS transistor M4 and the source terminal of PMOS transistor M6 of FIG. 2A. Implant region 210e is electrically coupled to implant region 208f and corresponds to the connection between the drain terminal of PMOS transistor M5 and the drain terminal of PMOS transistor M6 of FIG. 2A.

A parasitic pnp transistor 212e or 212f is formed by corresponding well NW5 or NW6, corresponding implant region 208e or 208f and corresponding implant region 210e or 210f. For example, the well NW5 forms a base of parasitic pnp transistor 212e, the implant region 208e forms an emitter of parasitic pnp transistor 212e and region 210e forms a collector of parasitic pnp transistor 212e. Similarly, the well NW6 forms a base of parasitic pnp transistor 212f, the implant region 208f forms a collector of parasitic pnp transistor 212f and region 210f forms an emitter of parasitic pnp transistor 212f. In some embodiments, at least parasitic pnp transistor 112a, 112b, 112c, 112d, 212e or 212f is a parasitic BJT.

In some embodiments, at least parasitic pnp transistor 112a, 112b, 112c, 112d, 212e or 212f is configured to provide a current path for an ESD event. In some embodiments, at least parasitic pnp transistor 112a, 112b, 112c, 112d, 212e or 212f is configured to block a current path for the ESD event.

In some embodiments, by positioning PMOS transistors M1, M2, M3, M4, M5 or M6 in corresponding separate wells NW4, NW1, NW3, NW2, NW5 or NW6, integrated circuit 200B has better ESD immunity and occupies less area than other approaches. In some embodiments, by having additional PMOS transistors M1, M2, M3, M4, M5 or M6 positioned in corresponding additional separate wells NW4, NW1, NW3, NW2, NW5 or NW6, integrated circuit 200B has better ESD immunity than other approaches with less transistors positioned in corresponding wells.

Figure 3B:
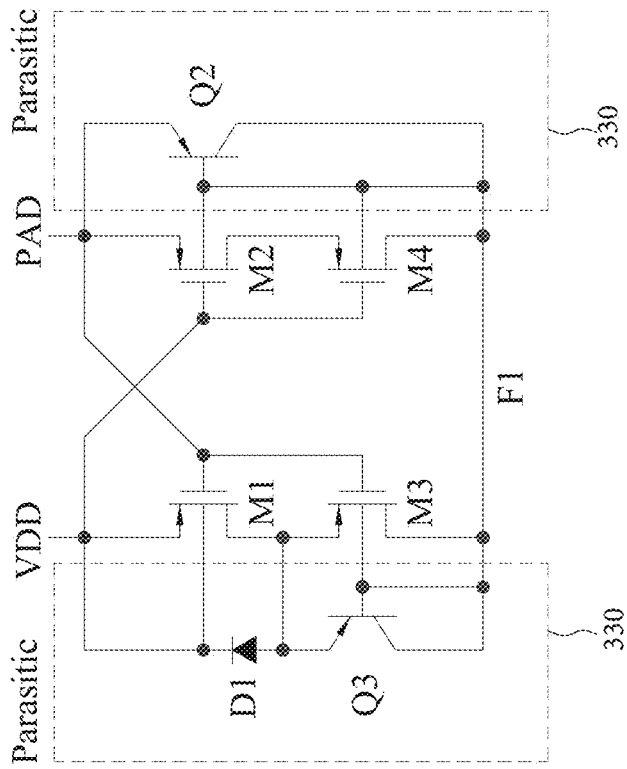
FIG. 3B is a circuit diagram of an equivalent circuit of integrated circuit, in accordance with some embodiments.
Figure 3A:
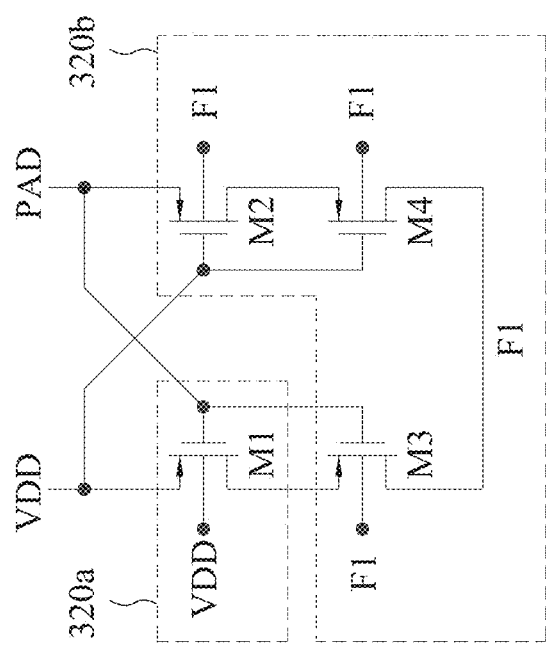
FIG. 3A is a circuit diagram of an integrated circuit, in accordance with some embodiments.
Figure 3C:
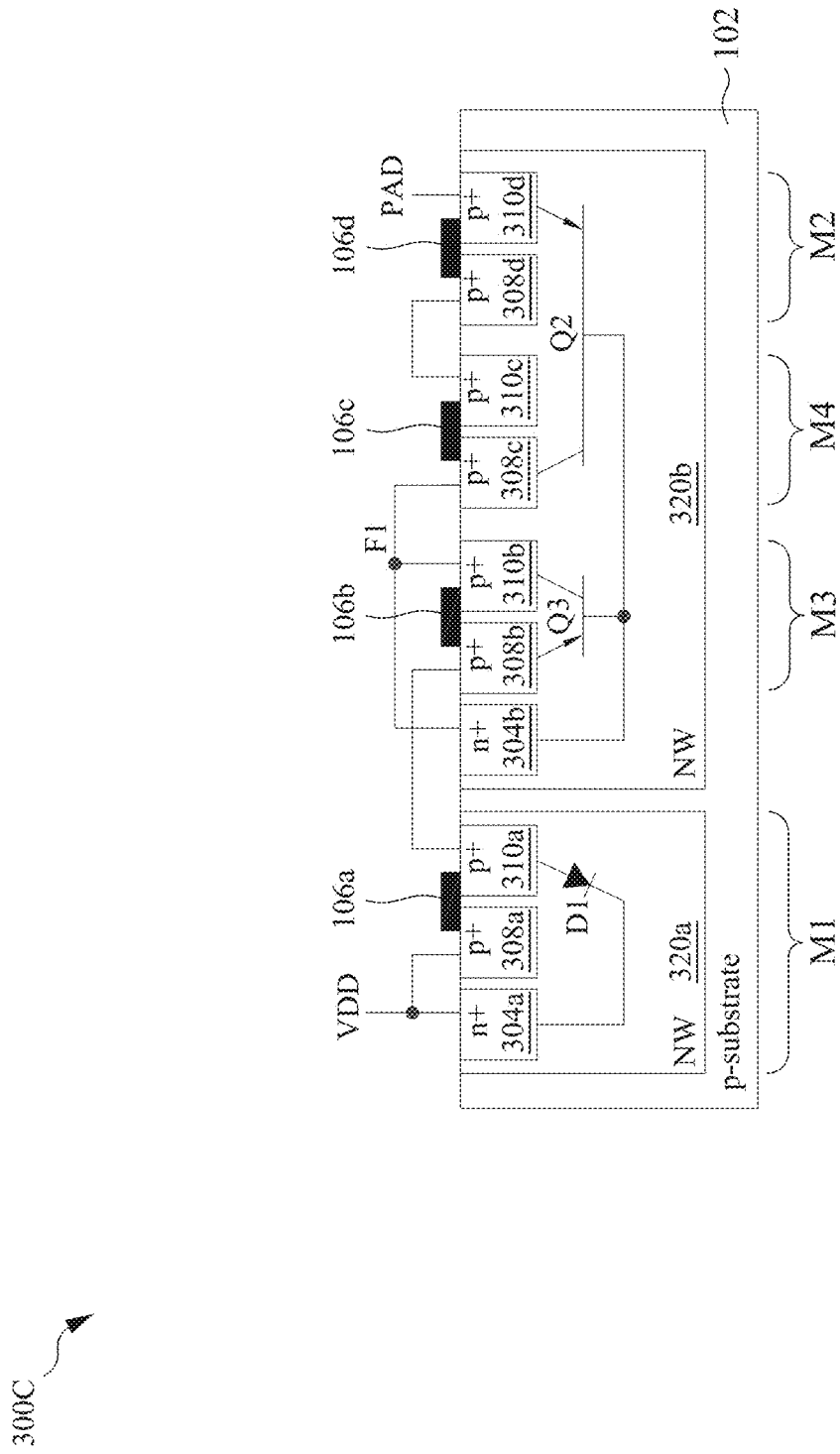
FIG. 3C is a cross-sectional view of integrated circuit, in accordance with some embodiments.

FIG. 3A is a circuit diagram of an integrated circuit 300A, in accordance with some embodiments. FIG. 3B is a circuit diagram of an equivalent circuit 300B of integrated circuit 300A, in accordance with some embodiments. FIG. 3C is a cross-sectional view of integrated circuit 300A, in accordance with some embodiments.

Integrated circuit 300A is an embodiment of integrated circuit 100A of FIG. 1A.

Integrated circuit 300A comprises PMOS transistors M1, M2, M3 and M4 coupled to the voltage supply VDD and the pad terminal PAD.

In comparison with integrated circuit 100A of FIG. 1A, PMOS transistor M1 is positioned in a well 320a (FIG. 3C), and PMOS transistors M2, M3 and M4 are positioned in a well 320b (FIG. 3C) different from well 320a.

The body terminal of PMOS transistor M1 and the source terminal of PMOS transistor M1 are coupled together, and are further coupled to the first voltage supply VDD. By coupling the body terminal of PMOS transistor M1, the source terminal of PMOS transistor M1 and the voltage supply VDD, the parasitic PNP transistor 112a of FIG. 1A is changed to a parasitic diode D1 (FIG. 3B).

PMOS transistors M2, M3 and M4 are positioned in a same well, (e.g., N-well 320b), and therefore the body terminal of PMOS transistor M2, the body terminal of PMOS transistor M3, and the body terminal of PMOS transistor M4 are coupled together.

Each of the body terminal of PMOS transistor M2, the body terminal of PMOS transistor M3, the body terminal of PMOS transistor M4, the drain terminal of PMOS transistor M3 and the drain terminal of PMOS transistor M4 are coupled together at a node F1. In some embodiments, node F1 is electrically floating. In some embodiments, node F1 is electrically coupled to supply voltage VDD by PMOS transistors M1 and M3. In some embodiments, node F1 is electrically coupled to pad terminal PAD by PMOS transistors M2 and M4.

FIG. 3B is a circuit diagram of an equivalent circuit 300B of integrated circuit 300A, in accordance with some embodiments.

Equivalent circuit 300B is a variation of integrated circuit 300A showing parasitic elements 330 of integrated circuit 300A, and similar detailed description is therefore omitted. For example, equivalent circuit 300B corresponds to integrated circuit 300A of FIG. 3A with parasitic elements 330 (e.g., diode D1, parasitic transistors Q2 and Q3), in accordance with some embodiments.

Equivalent circuit 300B includes integrated circuit 300A and parasitic elements 330. Parasitic elements 330 include a diode D1, a parasitic transistor Q2 and a parasitic transistor Q3.

Each of an anode of the diode D1, the source terminal of PMOS transistor M3, the drain terminal of PMOS transistor M1, and an emitter of parasitic transistor Q3 are coupled together. Each of a cathode of the diode D1, the body terminal of PMOS transistor M1, the source terminal of PMOS transistor M1, the gate of PMOS transistor M2, the gate of PMOS transistor M4 and the first voltage supply VDD are coupled together. In some embodiments, diode D1 is forward biased, and is configured to allow a current flow through diode D1 and a parasitic current path. In some embodiments, diode D1 is reverse biased, and is configured to block a current from flowing through diode D1 and the parasitic current path.

Each of a base of parasitic transistor Q3, a collector of parasitic transistor Q3, a base of parasitic transistor Q2, a collector of parasitic transistor Q2, the drain terminal of PMOS transistor M3, the drain terminal of PMOS transistor M4, the body terminal of PMOS transistor M2, the body terminal of PMOS transistor M3, and the body terminal of PMOS transistor M4 are coupled together at node F1.

Each of an emitter of parasitic transistor Q2, the source terminal of PMOS transistor M2, the gate of PMOS transistor M1, the gate of PMOS transistor M3 and the pad terminal PAD are coupled together.

In some embodiments, during an ESD event with positive stress from the pad terminal PAD to the voltage supply VDD, the voltage of the pad terminal PAD is greater than the voltage of the voltage supply VDD, and therefore PMOS transistors M2 and M4 are turned on, and PMOS transistors M1 and M3 are turned off, and the voltage of the pad terminal PAD will be placed at node F1. In these embodiments, when the voltage of node F1 is equal to the voltage of the pad terminal PAD, the whole voltage stress of the ESD event will be placed across PMOS transistors M3 and M1, thereby turning on parasitic transistor Q3 and diode Q3 to conduct the discharged ESD current to the voltage supply VDD. Thus, since the ESD current path includes two parasitic elements (e.g., parasitic diode D1 and parasitic transistor Q3) positioned in different wells (320a and 320b), the ESD immunity is boosted compared to other approaches.

In some embodiments, during an ESD event with negative stress from the voltage supply VDD to the pad terminal PAD, the voltage of the voltage supply VDD is greater than the voltage of the pad terminal PAD, and therefore PMOS transistors M1 and M3 are turned on, and PMOS transistors M2 and M4 are turned off, and the voltage of the voltage supply VDD will be placed at node F1. In these embodiments, when the voltage of node F1 is equal to the voltage of the voltage supply VDD, the whole voltage stress of the ESD event will be placed across PMOS transistors M2 and M4, thereby turning on parasitic transistor Q2 to conduct the discharged ESD current to the pad terminal PAD. Thus, the ESD current path includes one parasitic element (e.g., parasitic transistor Q2).

In some embodiments, the 2-stacked PMOS structure utilizing PMOS transistors M2 and M4 can be reduced to a single PMOS transistor (either M2 or M4), if negative stress ESD events are not an issue.

FIG. 3C is a cross-sectional view of integrated circuit 300A, in accordance with some embodiments.

Integrated circuit 300C is an embodiment of integrated circuit 100B of FIG. 1B, and similar detailed description is therefore omitted.

Integrated circuit 300C illustrates an example of where PMOS transistor M1 is positioned in well 320a, and PMOS transistors M2, M3 and M4 are positioned in well 320b. In other words, wells NW2, NW3 and NW4 of FIG. 1B are merged into well 320b.

Integrated circuit 300C comprises substrate 102, wells 320a and 320b, regions 304a and 304b, gates 106a, 106b, 106c and 106d, implant regions 308a, 308b, 308c and 308d, and implant regions 310a, 310b, 310c and 310d.

In comparison with integrated circuit 100B of FIG. 1B, well 320a replaces well NW1, and well 320b replaces wells NW2, NW3 and NW4 of FIG. 1B, and similar detailed description is therefore omitted. In other words, wells NW2, NW3 and NW4 of FIG. 1B are merged into well 320b, and similar detailed description is therefore omitted. Well 320b is different from well 320a. Well 320b is separated from well 320a in the first direction X.

Gate 106a is above well 320a, and gates 106b, 106c and 106d are above well 320b. For ease of illustration, gates 106a and 106b are not shown as being coupled to each other or other elements, and gates 106c and 106d are not shown as being coupled to each other or other elements.

In comparison with integrated circuit 100B of FIG. 1B, region 304a replaces region 104a, and region 304b replaces regions 104b, 104c and 104d of FIG. 1B, and similar detailed description is therefore omitted. In other words, regions 104b, 104c, 104d of FIG. 1B are merged into region 304a, and similar detailed description is therefore omitted. Region 304a is within well 320a, and region 304b is within well 320b.

In comparison with integrated circuit 100B of FIG. 1B, implant regions 308a, 308b, 308c and 308d replace corresponding implant regions 108a, 108b, 108c and 108d, and implant regions 310a, 310b, 310c and 310d replace corresponding implant regions 110a, 110b, 110c and 110d, and similar detailed description is therefore omitted.

Implant regions 308a and 310a are within well 320a. Implant regions 308b, 308c and 308d and implant regions 310b, 310c and 310d are within well 320b.

Each of region 304a, implant region 308a and voltage supply VDD are electrically coupled together and corresponds to the connection between the body terminal of PMOS transistor M1, the source terminal of PMOS transistor M1 and the voltage supply VDD of FIG. 3A.

Implant region 310a is electrically coupled to implant region 308b and corresponds to the connection between the drain terminal of PMOS transistor M1 and the source terminal of PMOS transistor M3 of FIG. 3A.

Each of implant region 310b, implant region 308c and region 304b are electrically coupled together at node F1, and corresponds to the connection between the drain terminal of PMOS transistor M3, the drain terminal of PMOS transistor M4 of FIG. 3A, the body terminal of PMOS transistor M2, the body terminal of PMOS transistor M3 and the body terminal of PMOS transistor M4 of FIG. 3A.

Implant region 310c is electrically coupled to implant region 308d and corresponds to the connection between the drain terminal of PMOS transistor M2 and the source terminal of PMOS transistor M4 of FIG. 3A.

Implant region 310d is electrically coupled to the pad terminal PAD and corresponds to the connection between the source terminal of PMOS transistor M2 and the pad terminal PAD of FIG. 3A.

In comparison with integrated circuit 100B of FIG. 1B, parasitic diode D1 replaces parasitic pnp transistor 112a of FIG. 1B, parasitic transistor Q3 replaces parasitic pnp transistor 112b of FIG. 1B, and parasitic transistor Q2 replaces parasitic pnp transistors 112c and 112d of FIG. 1B, and similar detailed description is therefore omitted.

Parasitic diode D1 is formed by well 320a and implant region 310a. For example, implant region 310a corresponds to the anode of diode D1, and well 320a corresponds to the cathode of diode D1.

Parasitic transistor Q3 is formed by well 320b, implant region 308b and implant region 310b. For example, the well 320b forms a base of parasitic transistor Q3, the implant region 308b forms an emitter of parasitic transistor Q3 and region 310b forms a collector of parasitic transistor Q3.

Parasitic transistor Q2 is formed by well 320b, implant region 308c and implant region 310d. For example, the well 320b forms a base of parasitic transistor Q2, the implant region 310d forms an emitter of parasitic transistor Q2 and region 308c forms a collector of parasitic transistor Q2.

In some embodiments, by positioning PMOS transistor M1 in well 320a, and by positioning PMOS transistors M2, M3 and M4 in a separate well (well 320b), the parasitic current path of integrated circuit 300C includes parasitic elements (e.g., parasitic diode D1 and parasitic transistors Q2 and Q3) positioned in different wells (320a and 320b), thereby improving the ESD immunity of integrated circuit 300A-300C compared to other approaches, and integrated circuit 300A-300C occupies less area than other approaches with similar performance.

Figure 4B:
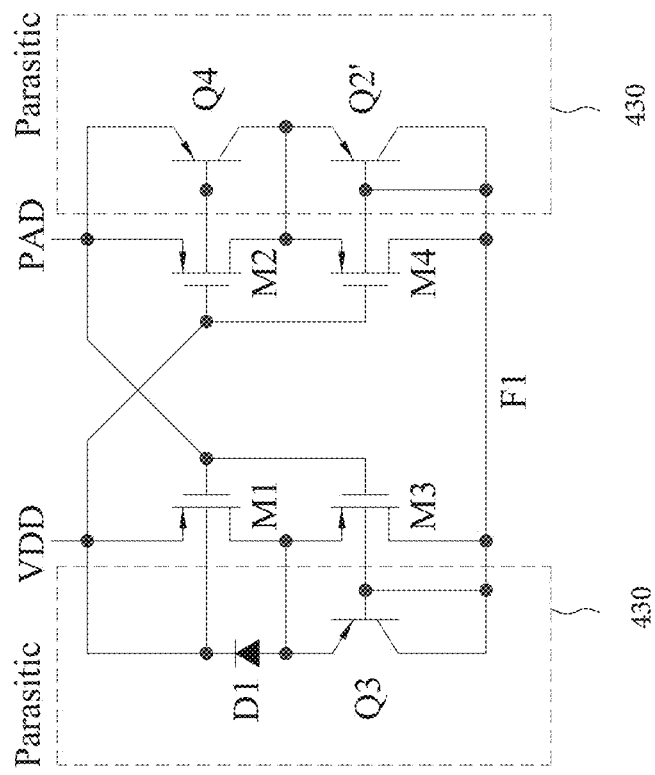
FIG. 4B is a circuit diagram of an equivalent circuit of integrated circuit, in accordance with some embodiments.
Figure 4A:
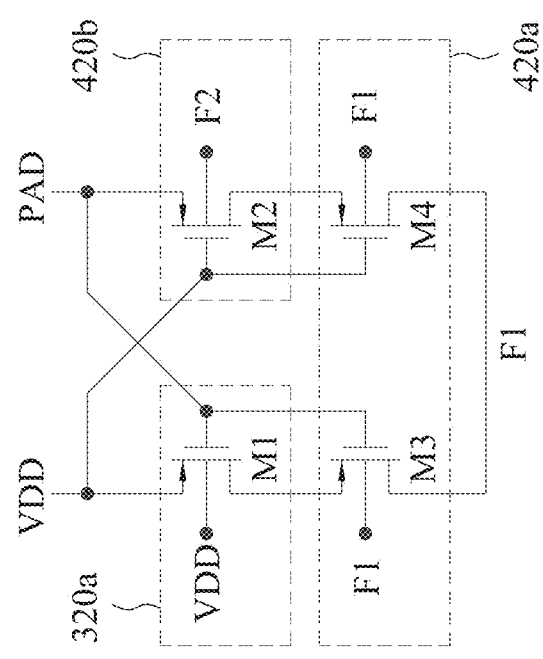
FIG. 4A is a circuit diagram of an integrated circuit, in accordance with some embodiments.
Figure 4C:
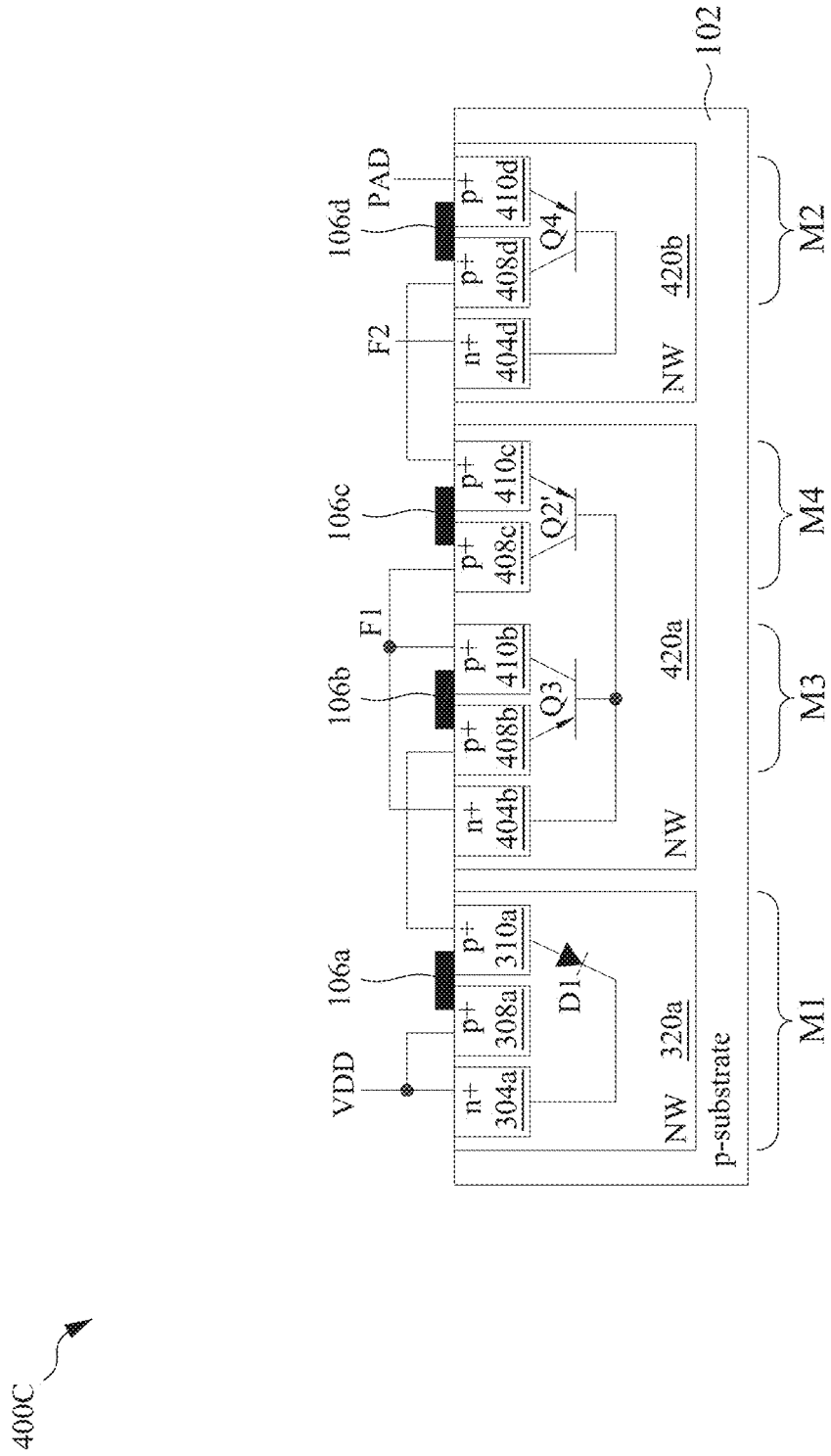
FIG. 4C is a cross-sectional view of integrated circuit, in accordance with some embodiments.

FIG. 4A is a circuit diagram of an integrated circuit 400A, in accordance with some embodiments. FIG. 4B is a circuit diagram of an equivalent circuit 400B of integrated circuit 400A, in accordance with some embodiments. FIG. 4C is a cross-sectional view of integrated circuit 400A, in accordance with some embodiments.

Integrated circuit 400A is an embodiment of integrated circuit 100A of FIG. 1A.

Integrated circuit 400A comprises PMOS transistors M1, M2, M3 and M4 coupled to the voltage supply VDD and the pad terminal PAD.

Integrated circuit 400A is a variation of integrated circuit 300A of FIG. 3A. In comparison with integrated circuit 300A of FIG. 3A, PMOS transistor M1 of integrated circuit 400A is positioned in well 320a (FIG. 4C), PMOS transistors M3 and M4 of integrated circuit 400A are positioned in well 420a (FIG. 4C), and PMOS transistor M2 of integrated circuit 400A is positioned in a well 420b (FIG. 4C), and similar detailed description is therefore omitted. In some embodiments, each of wells 320a, 420a and 420b are different from each other.

In comparison with integrated circuit 300A of FIG. 3A, PMOS transistor M2 of FIGS. 4A-4C is in well 420b, and therefore the body terminal of PMOS transistor M2 is no longer coupled to the body terminal of PMOS transistor M3 and the body terminal of PMOS transistor M4. The body terminal of PMOS transistor M2 in FIGS. 4A-4C is coupled to node F2. In some embodiments, node F2 is charged from the pad terminal PAD by a parasitic body diode of PMOS transistor M4. In some embodiments, the parasitic body diode is formed between the gate and drain of PMOS transistor M4.

For example, in some embodiments, during an ESD event, the voltage of the pad terminal PAD is sufficient to cause the parasitic body diode to turn on and conduct resulting in node F2 charging to the voltage of the pad terminal PAD. Thus, in these embodiments, node F2 is able to track the voltage of the pad terminal PAD without being directly coupled to the body terminal of PMOS transistor M3 and the body terminal of PMOS transistor M4 nwell controller that means no PMOS/NMOS connected to F2. However, node F2 voltage could track to PAD by parasitic BJT. In some embodiments, a parasitic body diode is formed by implant 410d and well 420b. In some embodiments, a parasitic body diode is formed by implant 408d and well 420b.

PMOS transistors M3 and M4 are positioned in a same well, (e.g., well 420a), and therefore the body terminal of PMOS transistor M3 and the body terminal of PMOS transistor M4 are coupled together. Each of the body terminal of PMOS transistor M3, the body terminal of PMOS transistor M4, the drain terminal of PMOS transistor M3 and the drain terminal of PMOS transistor M4 are coupled together at node F1. In some embodiments, node F1 is electrically floating. In some embodiments, node F1 is electrically coupled to supply voltage VDD by PMOS transistors M1 and M3. In some embodiments, node F1 is electrically coupled to pad terminal PAD by PMOS transistors M2 and M4.

FIG. 4B is a circuit diagram of an equivalent circuit 400B of integrated circuit 400A, in accordance with some embodiments.

Equivalent circuit 400B is a variation of integrated circuit 400A showing parasitic elements 430 of integrated circuit 400A, and similar detailed description is therefore omitted. For example, equivalent circuit 400B corresponds to integrated circuit 400A of FIG. 4A with parasitic elements 430 (e.g., diode D1, parasitic transistors Q2', Q3 and Q4), in accordance with some embodiments.

Equivalent circuit 400B includes integrated circuit 400A and parasitic elements 430. Parasitic elements 430 are a variation of parasitic elements 330 of FIG. 3B, and similar detailed description is therefore omitted. Parasitic elements 430 include diode D1 of FIG. 3B, a parasitic transistor Q2', parasitic transistor Q3 of FIG. 3B and a parasitic transistor Q4.

In comparison with parasitic elements 330 of FIGS. 3B-3C, parasitic transistor Q2' and parasitic transistor Q4 replace parasitic transistor Q2 of FIG. 3B, and similar detailed description is therefore omitted.

In comparison with parasitic elements 330 of FIGS. 3B-3C, for FIG. 4B, each of the base of parasitic transistor Q3, the collector of parasitic transistor Q3, a base of parasitic transistor Q2', a collector of parasitic transistor Q2', the drain terminal of PMOS transistor M3, the drain terminal of PMOS transistor M4, the body terminal of PMOS transistor M3, and the body terminal of PMOS transistor M4 are coupled together at node F1.

In FIG. 4B, each of an emitter of parasitic transistor Q4, the source terminal of PMOS transistor M2, the gate of PMOS transistor M1, the gate of PMOS transistor M3 and the pad terminal PAD are coupled together. In FIG. 4B, a base of parasitic transistor Q4 is coupled to the body terminal of PMOS transistor M2.

In FIG. 4B, each of an emitter of parasitic transistor Q2', a collector of parasitic transistor Q4, the drain terminal of PMOS transistor M2 and the source of PMOS transistor M4 are coupled together.

In some embodiments, during an ESD event with positive stress from the pad terminal PAD to the voltage supply VDD, the voltage of the pad terminal PAD is greater than the voltage of the voltage supply VDD, and therefore PMOS transistors M2 and M4 are turned on, and PMOS transistors M1 and M3 are turned off, and the voltage of the pad terminal PAD will be placed at node F1. In these embodiments, when the voltage of node F1 is equal to the voltage of the pad terminal PAD, the whole voltage stress of the ESD event will be placed across PMOS transistors M3 and M1, thereby turning on parasitic transistor Q3 and diode D1 to conduct the discharged ESD current to the voltage supply VDD. Thus, since the parasitic current path includes two parasitic elements (e.g., parasitic diode D1 and parasitic transistor Q3) positioned in different wells (320a and 420a), the ESD immunity is boosted compared to other approaches.

In some embodiments, during an ESD event with negative stress from the voltage supply VDD to the pad terminal PAD, the voltage of the voltage supply VDD is greater than the voltage of the pad terminal PAD, and therefore PMOS transistors M1 and M3 are turned on, and PMOS transistors M2 and M4 are turned off, and the voltage of the voltage supply VDD will be placed at node F1. In these embodiments, when the voltage of node F1 is equal to the voltage of the voltage supply VDD, the whole voltage stress of the ESD event will be placed across PMOS transistors M2 and M4, thereby turning on parasitic transistors Q2' and Q4 to conduct the discharged ESD current to the pad terminal PAD. Thus, since the ESD current path includes two parasitic elements (e.g., parasitic transistor Q4 and parasitic transistor Q2') positioned in different wells (420a and 420b), the ESD immunity is boosted compared to other approaches.

FIG. 4C is a cross-sectional view of integrated circuit 400A, in accordance with some embodiments.

Integrated circuit 400C is an embodiment of integrated circuit 100B of FIG. 1B or integrated circuit 300B of FIG. 3B, and similar detailed description is therefore omitted.

Integrated circuit 400C illustrates an example of where PMOS transistor M1 is positioned in well 320a, PMOS transistors M3 and M4 are positioned in well 420a, and PMOS transistor M2 is positioned in well 420b. In comparison with integrated circuit 100B of FIG. 1B, wells NW3 and NW4 of FIG. 1B are merged into well 420a.

Integrated circuit 400C comprises substrate 102, wells 320a, 420a and 420b, regions 304a, 404b and 404d, gates 106a, 106b, 106c and 106d, implant regions 308a, 408b, 408c and 408d, and implant regions 310a, 410b, 410c and 410d.

In comparison with integrated circuit 100B of FIG. 1B, well 320a replaces well NW1, and well 420a replaces wells NW3 and NW2 of FIG. 1B, and well 420b replaces wells NW1 of FIG. 1B, and similar detailed description is therefore omitted. In other words, wells NW2 and NW3 of FIG. 1B are merged into well 420a, and similar detailed description is therefore omitted. Each of wells 320a, 420a and 420b are separated from each other in the first direction X. In some embodiments, each of wells 320a, 420a and 420b are different from each other.

Gate 106a is above well 320a, gates 106b and 106c are above well 420a and gate 106d is above well 420b. For ease of illustration, gates 106a and 106b are not shown as being coupled to each other or other elements, and gates 106c and 106d are not shown as being coupled to each other or other elements.

In comparison with integrated circuit 100B of FIG. 1B, region 404b replaces regions 104b and 104c of FIG. 1B, and region 404d replaces regions 104d of FIG. 1B, and similar detailed description is therefore omitted. Stated differently, regions 104b and 104c of FIG. 1B are merged into region 404b, and similar detailed description is therefore omitted. Region 304a is within well 320a, region 404b is within well 420a and region 404d is within well 420b.

Integrated circuit 400C is a variation of integrated circuit 300C of FIG. 3C, and similar detailed description is therefore omitted. In comparison with integrated circuit 300C of FIG. 3C, implant regions 408b, 408c and 408d replace corresponding implant regions 308b, 308c and 308d, and implant regions 410b, 410c and 410d replace corresponding implant regions 310b, 310c and 310d, and similar detailed description is therefore omitted.

Implant regions 408b and 408c and implant regions 410b and 410c are within well 420a. Implant region 408d and implant region 410d are within well 420b.

Implant region 310a is electrically coupled to implant region 408b and corresponds to the connection between the drain terminal of PMOS transistor M1 and the source terminal of PMOS transistor M3 of FIG. 4A.

Each of implant region 410b, implant region 408c and region 404b are electrically coupled together at node F1, and corresponds to the connection between the drain terminal of PMOS transistor M3, the drain terminal of PMOS transistor M4 of FIG. 4A, the body terminal of PMOS transistor M3 and the body terminal of PMOS transistor M4.

Region 404d is electrically coupled to node F2, and corresponds to the connection between the body terminal of PMOS transistor M2 and node F2 in FIG. 4A.

Implant region 410c is electrically coupled to implant region 408d and corresponds to the connection between the drain terminal of PMOS transistor M2 and the source terminal of PMOS transistor M4 of FIG. 4A.

Implant region 410d is electrically coupled to the pad terminal PAD and corresponds to the connection between the source terminal of PMOS transistor M2 and the pad terminal PAD of FIG. 4A.

Integrated circuit 400C includes parasitic diode D1 of FIG. 3C, a parasitic transistor Q2', parasitic transistor Q3 of FIG. 3C and a parasitic transistor Q4. In comparison with integrated circuit 300C of FIG. 3C, parasitic transistor Q2' and parasitic transistor Q4 replace parasitic Q2 of FIG. 3C, and similar detailed description is therefore omitted.

In comparison with integrated circuit 100B of FIG. 1B, parasitic transistor Q2' replaces parasitic pnp transistor 112c of FIG. 1B, and parasitic transistor Q4 replaces parasitic pnp transistor 112d of FIG. 1B, and similar detailed description is therefore omitted.

Parasitic transistor Q2' is formed by well 420a, implant region 408c and implant region 410c. For example, the well 420a forms a base of parasitic transistor Q2', the implant region 410c forms an emitter of parasitic transistor Q2' and region 408c forms a collector of parasitic transistor Q2'.

Parasitic transistor Q4 is formed by well 420b, implant region 408d and implant region 410d. For example, the well 420b forms a base of parasitic transistor Q4, the implant region 410d forms an emitter of parasitic transistor Q4 and region 408d forms a collector of parasitic transistor Q4.

In some embodiments, by positioning PMOS transistor M1 in well 320a, by positioning PMOS transistors M3 and M4 in a separate well (well 420a), and by positioning PMOS transistor M2 in another separate well (well 420b), a parasitic current path of integrated circuit 400C includes parasitic elements (e.g., parasitic diode D1 and parasitic transistor Q3) positioned in different wells (320a and 420a), and another parasitic current path of integrated circuit 400C includes parasitic elements (e.g., parasitic transistors Q2' and Q4) positioned in different wells (420a and 420b), thereby improving the ESD immunity of integrated circuit 400A-400C compared to other approaches, and integrated circuit 400A-400C occupies less area than other approaches with similar performance.

Figure 5B:
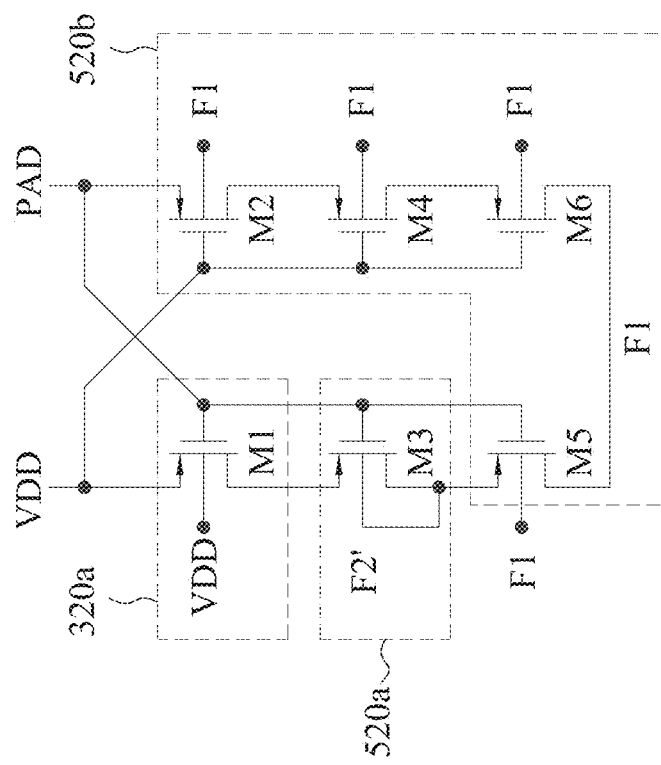
FIG. 5B is a circuit diagram of an equivalent circuit of integrated circuit, in accordance with some embodiments.
Figure 5A:
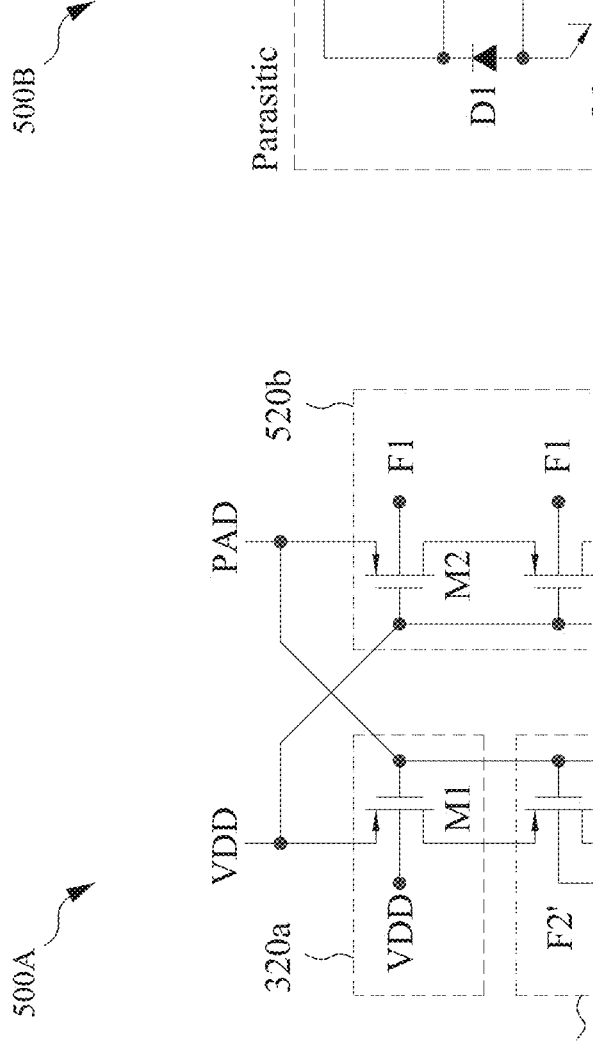
FIG. 5A is a circuit diagram of an integrated circuit, in accordance with some embodiments.
Figure 5C:
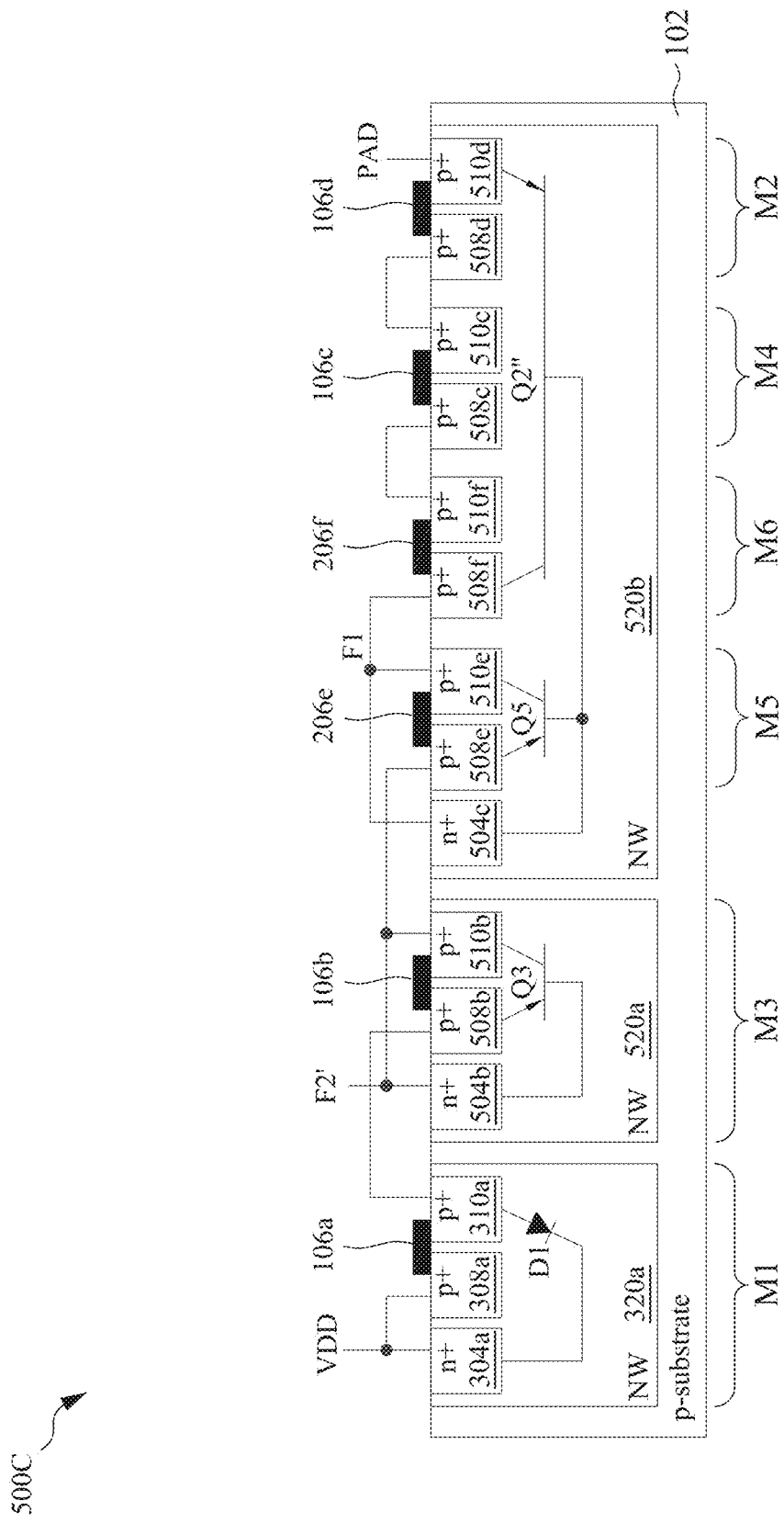
FIG. 5C is a cross-sectional view of integrated circuit, in accordance with some embodiments.

FIG. 5A is a circuit diagram of an integrated circuit 500A, in accordance with some embodiments. FIG. 5B is a circuit diagram of an equivalent circuit 500B of integrated circuit 500A, in accordance with some embodiments. FIG. 5C is a cross-sectional view of integrated circuit 500A, in accordance with some embodiments.

Integrated circuit 500A is an embodiment of integrated circuit 200A of FIG. 2A, and similar detailed description is therefore omitted. In comparison with integrated circuit 200A of FIG. 2A, PMOS transistor M1 is positioned in well 320a (FIG. 5C), PMOS transistor M3 is positioned in a well 520a (FIG. 5C), and PMOS transistors M2, M4, M5 and M6 are positioned in a well 520b (FIG. 5C). In some embodiments, each of wells 320a, 520a and 520b are separated from each other and are thus different.

Integrated circuit 500A comprises PMOS transistors M1, M2, M3, M4, M5 and M6 coupled to the voltage supply VDD and the pad terminal PAD.

Integrated circuit 500A is a variation of integrated circuit 400A of FIG. 4A, and similar detailed description is therefore omitted.

PMOS transistors M2, M4, M5 and M6 are positioned in a same well, (e.g., well 520b). Each of the body terminal of PMOS transistor M2, the body terminal of PMOS transistor M4, the body terminal of PMOS transistor M5, the body terminal of PMOS transistor M6, the drain terminal of PMOS transistor M5 and the drain terminal of PMOS transistor M6 are coupled together at node F1. In some embodiments, node F1 is electrically floating. In some embodiments, node F1 is electrically coupled to supply voltage VDD by PMOS transistors M1, M3 and M5. In some embodiments, node F1 is electrically coupled to pad terminal PAD by PMOS transistors M2 M4 and M6.

PMOS transistor M3 is positioned in well 520a. In FIGS. 5A-5C and 6A-6C, a body terminal of PMOS transistor M3, the drain terminal of PMOS transistor M3, and the source terminal of PMOS transistor M5 are coupled together at a node F2'. In some embodiments, by coupling the body terminal of PMOS transistor M3 to the drain terminal of PMOS transistor M3, PMOS transistor M3 is self-biased and node F2' is not provided a bias voltage from a circuit external of integrated circuit 500A.

FIG. 5B is a circuit diagram of an equivalent circuit 500B of integrated circuit 500A, in accordance with some embodiments.

Equivalent circuit 500B is a variation of integrated circuit 500A showing parasitic elements 530 of integrated circuit 500A, and similar detailed description is therefore omitted. For example, equivalent circuit 500B corresponds to integrated circuit 500A of FIG. 5A with parasitic elements 530 (e.g., diode D1, parasitic transistors Q2", Q3 and Q5), in accordance with some embodiments.

Equivalent circuit 500B is a variation of equivalent circuit 300B of FIG. 3B or 400B of FIG. 4B, and similar detailed description is therefore omitted.

Equivalent circuit 500B includes integrated circuit 500A and parasitic elements 530. Parasitic elements 530 include diode D1, a parasitic transistor Q2", parasitic transistor Q3 and a parasitic transistor Q5.

Each of the gate of PMOS transistor M6, the cathode of the diode D1, the body terminal of PMOS transistor M1, the source terminal of PMOS transistor M1, the gate of PMOS transistor M2, the gate of PMOS transistor M4, and the first voltage supply VDD are coupled together.

For FIGS. 5A-5C & 6A-6C, each of an emitter of parasitic transistor Q5, the base of parasitic transistor Q3, the collector of parasitic transistor Q3, the drain terminal of PMOS transistor M3 and the source terminal of PMOS transistor M5 are coupled together.

For FIGS. 5A-5C, each of a collector of parasitic transistor Q5, a base of parasitic transistor Q5, the body terminal of PMOS transistor M5, the drain terminal of PMOS transistor M5, the drain terminal of PMOS transistor M6, the body terminal of PMOS transistor M6, the body terminal of PMOS transistor M4, the body terminal of PMOS transistor M2, a collector of parasitic transistor Q2" and a base of parasitic transistor Q2" are coupled together at node F1.

Each of an emitter of parasitic transistor Q2", the gate of PMOS transistor M5, the source terminal of PMOS transistor M2, the gate of PMOS transistor M1, the gate of PMOS transistor M3 and the pad terminal PAD are coupled together.

In some embodiments, during an ESD event with positive stress from the pad terminal PAD to the voltage supply VDD, the voltage of the pad terminal PAD is greater than the voltage of the voltage supply VDD, and therefore PMOS transistors M2, M4 and M6 are turned on, and PMOS transistors M1, M3 and M5 are turned off, and the voltage of the pad terminal PAD will be placed at node F1. In these embodiments, when the voltage of node F1 is equal to the voltage of the pad terminal PAD, the whole voltage stress of the ESD event will be placed across PMOS transistors M5, M3 and M1, thereby turning on parasitic transistors Q5 and Q3 and diode D1 to conduct the discharged ESD current to the voltage supply VDD. Thus, since the ESD current path includes three parasitic elements (e.g., parasitic diode D1, parasitic transistor Q3 and parasitic transistor Q5) positioned in different wells (320a, 520a and 520b), the ESD immunity is boosted compared to other approaches.

In some embodiments, during an ESD event with negative stress from the voltage supply VDD to the pad terminal PAD, the voltage of the voltage supply VDD is greater than the voltage of the pad terminal PAD, and therefore PMOS transistors M1 M3, and M5 are turned on, and PMOS transistors M2, M4 and M6 are turned off, and the voltage of the voltage supply VDD will be placed at node F1. In these embodiments, when the voltage of node F1 is equal to the voltage of the voltage supply VDD, the whole voltage stress of the ESD event will be placed across PMOS transistors M2, M4 and M6, thereby turning on parasitic transistor Q2" to conduct the discharged ESD current to the pad terminal PAD. Thus, the ESD current path includes one parasitic element (e.g., parasitic transistor Q2").

In some embodiments, the 3-stacked PMOS structure utilizing PMOS transistors M2, M4 and M6 can be reduced to a single PMOS transistor (one of M2, M4 or M6) or a 2-stacked PMOS structure utilizing two PMOS transistors (two of M2, M4 or M6), if negative stress ESD events are not an issue.

FIG. 5C is a cross-sectional view of integrated circuit 500A, in accordance with some embodiments.

Integrated circuit 500C is an embodiment of integrated circuit 200B of FIG. 2B, and similar detailed description is therefore omitted.

Integrated circuit 500C illustrates an example of PMOS transistor M1 positioned in well 320a, PMOS transistor M3 is positioned in well 520a, and PMOS transistors M2, M4, M5 and M6 are positioned in well 520b. In some embodiments, each of wells 320a, 520a and 520b are separated from each other and are thus different.

Integrated circuit 500C comprises substrate 102, wells 320a, 520a and 520b, regions 304a, 504b and 504c, gates 106a, 106b, 106c, 106d, 206e and 206f, implant regions 308a, 508b, 508c, 508d, 508e and 508f, and implant regions 310a, 510b, 510c, 510d, 510e and 510f.

In comparison with integrated circuit 200B of FIG. 2B, well 320a replaces well NW4, well 520a replaces well NW3, and well 520b replaces wells NW5, NW6, NW2 and NW1 of FIG. 2B, and similar detailed description is therefore omitted.

In other words, wells NW5, NW6, NW2 and NW1 of FIG. 2B are merged into well 520b, and similar detailed description is therefore omitted. Each of well 320a, 520a and 520b are separated from each other in the first direction X. In some embodiments, at least well 320a, 520a or 520b is different from another of at least well 320a, 520a or 520b.

Gate 106a is above well 320a, gate 106b is above well 520a, and gates 106b, 106c, 106d, 206e and 206f are above well 520b. For ease of illustration, gates 106a, 106b and 206e are not shown as being coupled to each other or other elements, and gates 106c, 106d and 206f are not shown as being coupled to each other or other elements.

In comparison with integrated circuit 200B of FIG. 2B, region 304a replaces region 104a, region 504b replaces region 104b of FIG. 2B, and region 504c replaces regions 104c, 104d, 204e and 204f of FIG. 2B, and similar detailed description is therefore omitted. Stated differently, regions 104c, 104d, 204e and 204f of FIG. 2B are merged into region 504b, and similar detailed description is therefore omitted. Region 304a is within well 320a, region 504b is within well 520a and region 504c is within well 520b.

Integrated circuit 500C is a variation of integrated circuit 300C of FIG. 3C, and similar detailed description is therefore omitted. In comparison with integrated circuit 300C of FIG. 3C, implant regions 508b, 508c and 508d replace corresponding implant regions 308b, 308c and 308d, and implant regions 510b, 510c and 510d replace corresponding implant regions 310b, 310c and 310d, and similar detailed description is therefore omitted. Implant regions 308a and 310a are described in FIG. 3C, and similar detailed description is therefore omitted.

In comparison with integrated circuit 200B of FIG. 2B, implant regions 508b, 508c, 508d, 508e and 508f replace corresponding implant regions 108b, 108c, 108d, 208e and 208f, and implant regions 510b, 510c, 510d, 510e and 510f replace corresponding implant regions 110b, 110c, 110d, 210e and 210f, and similar detailed description is therefore omitted.

Implant regions 308a and 310a are within well 320a. Implant regions 508b and 510b are within well 520a. Implant regions 508c, 508d, 508e and 508f and implant regions 510c, 510d, 510e and 510f are within well 520b.

Implant region 310a is electrically coupled to implant region 508b and corresponds to the connection between the drain terminal of PMOS transistor M1 and the source terminal of PMOS transistor M3 of FIG. 5A.

Each of region 504c, implant region 510e and implant region 508f are electrically coupled together at node F1, and corresponds to the connection between the body terminal of PMOS transistor M5, the drain terminal of PMOS transistor M5, the drain terminal of PMOS transistor M6, the body terminal of PMOS transistor M6, the body terminal of PMOS transistor M4, and the body terminal of PMOS transistor M2 at node F1.

Each of region 504b, implant region 510b and implant region 508e are electrically coupled together at node F2', and corresponds to the connection between the body terminal of PMOS transistor M3, the drain terminal of PMOS transistor M3 and the source terminal of PMOS transistor M5 of FIG. 5A.

Implant region 510f is electrically coupled to implant region 508c and corresponds to the connection between the source terminal of PMOS transistor M6 and the drain terminal of PMOS transistor M4 of FIG. 5A.

Implant region 510c is electrically coupled to implant region 508d and corresponds to the connection between the source terminal of PMOS transistor M4 and the drain terminal of PMOS transistor M2 of FIG. 5A.

Implant region 510d is electrically coupled to the pad terminal PAD and corresponds to the connection between the source terminal of PMOS transistor M2 and the pad terminal PAD of FIG. 5A.

Integrated circuit 500C includes parasitic diode D1 of FIG. 3C, a parasitic transistor Q2", parasitic transistor Q3 of FIG. 3C and a parasitic transistor Q5. Parasitic diode D1 is described in FIG. 3C, and parasitic transistor Q3 is described in FIG. 3C, and similar detailed description is therefore omitted.

In comparison with integrated circuit 200B of FIG. 2+B, parasitic transistor Q2" replaces parasitic pnp transistors 212f, 112c and 112d of FIG. 2B, and parasitic transistor Q5 replaces parasitic pnp transistor 212e of FIG. 2B, and similar detailed description is therefore omitted.

Parasitic transistor Q3 in FIG. 5C is formed by well 520a, implant region 508b and implant region 510b. For example, the well 520a forms the base of parasitic transistor Q3 in FIG. 5C, the implant region 508b forms the emitter of parasitic transistor Q3 in FIG. 5C and region 510b forms the collector of parasitic transistor Q3 in FIG. 5C.

Parasitic transistor Q2" is formed by well 520b, implant region 508f and implant region 510d. For example, the well 520b forms a base of parasitic transistor Q2", the implant region 510d forms an emitter of parasitic transistor Q2" and region 508f forms a collector of parasitic transistor Q2".

Parasitic transistor Q5 is formed by well 520*b*, implant region 508*e* and implant region 510*e*. For example, the well 520*b* forms a base of parasitic transistor Q5, the implant region 508*e* forms an emitter of parasitic transistor Q5 and region 510*e* forms a collector of parasitic transistor Q5.

In some embodiments, by positioning PMOS transistor M1 in well 320*a*, by positioning PMOS transistor M3 in a separate well (well 520*a*), and by positioning PMOS transistors M5, M6, M4 and M2 in another separate well (well 520*b*), a parasitic current path of integrated circuit 500C includes parasitic elements (e.g., parasitic diode D1, parasitic transistor Q3 and parasitic transistor Q5) positioned in different wells (320*a*, 520*a* and 520*b*), and another parasitic current path of integrated circuit 500C includes parasitic elements (e.g., parasitic transistor Q2") positioned in the another well (520*b*), thereby improving the ESD immunity of integrated circuit 500A-500C compared to other approaches, and integrated circuit 500A-500C occupies less area than other approaches with similar performance.

Figure 6B:
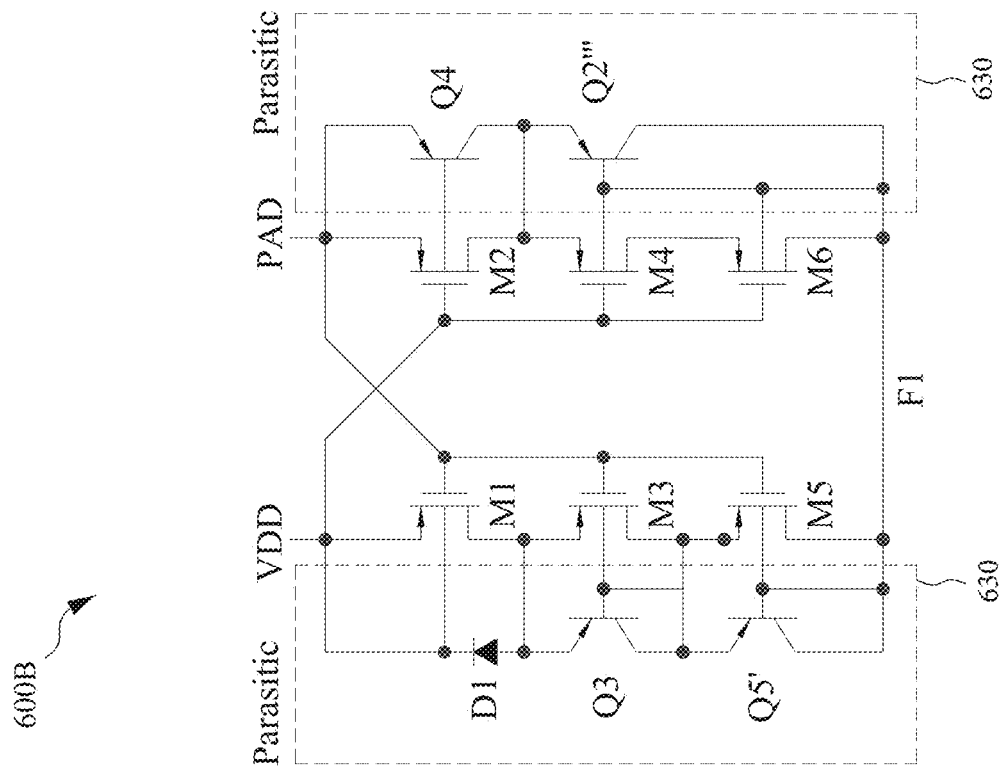
FIG. 6B is a circuit diagram of an equivalent circuit of integrated circuit, in accordance with some embodiments.
Figure 6A:
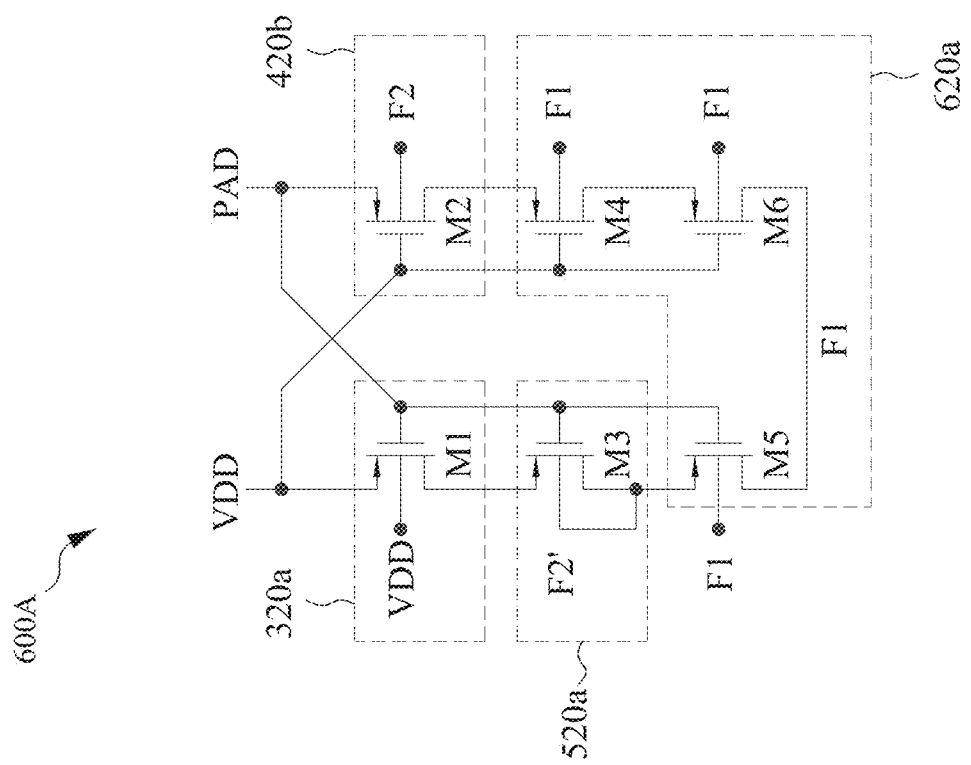
FIG. 6A is a circuit diagram of an integrated circuit, in accordance with some embodiments.
Figure 6C:
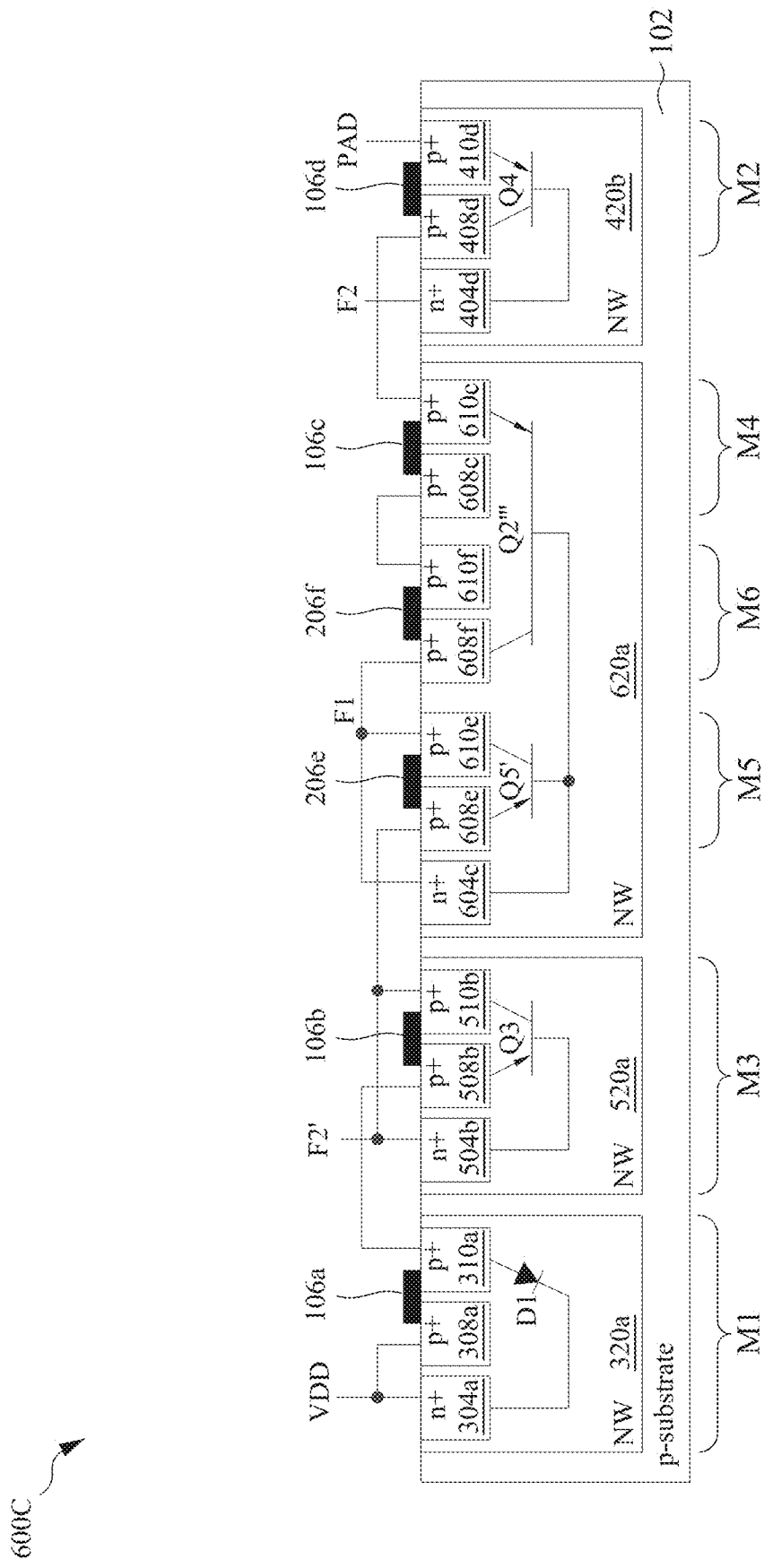
FIG. 6C is a cross-sectional view of integrated circuit, in accordance with some embodiments.

FIG. 6A is a circuit diagram of an integrated circuit 600A, in accordance with some embodiments. FIG. 6B is a circuit diagram of an equivalent circuit 600B of integrated circuit 600A, in accordance with some embodiments. FIG. 6C is a cross-sectional view of integrated circuit 600A, in accordance with some embodiments.

Integrated circuit 600A is an embodiment of integrated circuit 200A of FIG. 2A.

Integrated circuit 600A comprises PMOS transistors M1, M2, M3, M4, M5 and M6 coupled to the voltage supply VDD and the pad terminal PAD.

Integrated circuit 600A is a variation of integrated circuit 500A of FIG. 5A and integrated circuit 400A of FIG. 4A. In comparison with integrated circuit 500A of FIG. 5A or integrated circuit 400A of FIG. 4A, PMOS transistor M1 of integrated circuit 600A is positioned in well 320*a* (FIG. 6C), PMOS transistor M3 of integrated circuit 600A is positioned in well 520*a* (FIG. 6C), PMOS transistor M2 of integrated circuit 600A is positioned in well 420*b* (FIG. 6C), and PMOS transistors M4, M5 and M6 of integrated circuit 600A are positioned in a well 620*a* (FIG. 6C), and similar detailed description is therefore omitted.

In some embodiments, each of wells 320*a*, 420*b*, 520*a* and 620*a* are different from each other.

In comparison with integrated circuit 500A of FIG. 5A, PMOS transistor M2 of FIGS. 6A-6C is in well 420*b* and the body terminal of PMOS transistor M2 is coupled to node F2. In some embodiments, node F2 is charged from the pad terminal PAD by the parasitic body diode of PMOS transistor M4.

The configuration of PMOS transistor M1 in FIGS. 6A-6C is similar to the configurations of PMOS transistor M1 in at least FIGS. 3A-3C, and similar detailed description is therefore omitted. The configuration of PMOS transistor M3 in FIGS. 6A-6C is similar to the configurations of PMOS transistor M3 in at least FIGS. 5A-5C, and similar detailed description is therefore omitted.

PMOS transistors M4, M5 and M6 are positioned in a same well (e.g., well 620*a*). Each of the body terminal of PMOS transistor M4, the body terminal of PMOS transistor M5, the body terminal of PMOS transistor M6, the drain terminal of PMOS transistor M5 and the drain terminal of PMOS transistor M6 are coupled together at node F1 in FIGS. 6A-6C. In some embodiments, node F1 is electrically floating. In some embodiments, node F1 is electrically coupled to supply voltage VDD by PMOS transistors M1, M3 and M5. In some embodiments, node F1 is electrically coupled to pad terminal PAD by PMOS transistors M2, M4 and M6.

FIG. 6B is a circuit diagram of an equivalent circuit 600B of integrated circuit 600A, in accordance with some embodiments.

Equivalent circuit 600B is a variation of integrated circuit 600A showing parasitic elements 630 of integrated circuit 600A, and similar detailed description is therefore omitted. For example, equivalent circuit 600B corresponds to integrated circuit 600A of FIG. 6A with parasitic elements 630 (e.g., diode D1, parasitic transistors Q2''', Q3, Q4 and Q5), in accordance with some embodiments.

Equivalent circuit 600B is a variation of equivalent circuit 500B of FIG. 5B or 400B of FIG. 4B, and similar detailed description is therefore omitted.

Equivalent circuit 600B includes integrated circuit 600A and parasitic elements 630. Parasitic elements 630 include diode D1, parasitic transistor Q2''', parasitic transistor Q3, parasitic transistor Q4 and parasitic transistor Q5.

The configuration of diode D1, parasitic transistor Q3, and parasitic transistor Q5 in FIGS. 6A-6C is similar to the configurations of diode D1, parasitic transistor Q3, and parasitic transistor Q5 in at least FIGS. 5A-5C, and similar detailed description is therefore omitted.

For FIGS. 6A-6C, each of the collector of parasitic transistor Q5, the base of parasitic transistor Q5, the body terminal of PMOS transistor M5, the drain terminal of PMOS transistor M5, the drain terminal of PMOS transistor M6, the body terminal of PMOS transistor M6, the body terminal of PMOS transistor M4, the collector of parasitic transistor Q2''' and the base of parasitic transistor Q2''' are coupled together at node F1.

For FIGS. 6A-6C, each of an emitter of parasitic transistor Q4, the gate of PMOS transistor M5, the source terminal of PMOS transistor M2, the gate of PMOS transistor M1, the gate of PMOS transistor M3 and the pad terminal PAD are coupled together.

For FIGS. 6A-6C, the body terminal of PMOS transistor M2 is coupled to base of parasitic transistor Q4.

For FIGS. 6A-6C, each of the drain terminal of PMOS transistor M2, the source terminal of PMOS transistor M4, the collector of parasitic transistor Q4 and the emitter of parasitic transistor Q2''' are coupled together.

In some embodiments, during an ESD event with positive stress from the pad terminal PAD to the voltage supply VDD, the voltage of the pad terminal PAD is greater than the voltage of the voltage supply VDD, and therefore PMOS transistors M2, M4 and M6 are turned on, and PMOS transistors M1, M3 and M5 are turned off, and the voltage of the pad terminal PAD will be placed at node F1. In these embodiments, when the voltage of node F1 is equal to the voltage of the pad terminal PAD, the whole voltage stress of the ESD event will be placed across PMOS transistors M5, M3 and M1, thereby turning on parasitic transistors Q5' and Q3 and diode D1 to conduct the discharged ESD current to the voltage supply VDD. Thus, since the ESD current path includes three parasitic elements (e.g., parasitic diode D1, parasitic transistor Q3 and parasitic transistor Q5') positioned in different wells (320*a*, 520*a* and 620*a*), the ESD immunity is boosted compared to other approaches.

In some embodiments, during an ESD event with negative stress from the voltage supply VDD to the pad terminal PAD, the voltage of the voltage supply VDD is greater than the voltage of the pad terminal PAD, and therefore PMOS transistors M1 M3, and M5 are turned on, and PMOS transistors M2, M4 and M6 are turned off, and the voltage of the voltage supply VDD will be placed at node F1. In these embodiments, when the voltage of node F1 is equal to the voltage of the voltage supply VDD, the whole voltage stress of the ESD event will be placed across PMOS transistors M2, M4 and M6, thereby turning on parasitic transistors Q2''' and Q4 to conduct the discharged ESD current to the pad terminal PAD. Thus, since the parasitic current path includes two parasitic elements (e.g., parasitic transistor Q4 and parasitic transistor Q2''') positioned in different wells (420b and 620a), the ESD immunity is boosted compared to other approaches.

In some embodiments, the 2-stacked PMOS structure in a same well (well 620a) utilizing PMOS transistors M4 and M6 can be reduced to a single PMOS transistor (one of M4 or M6), if negative stress ESD events are not an issue.

FIG. 6C is a cross-sectional view of integrated circuit 600A, in accordance with some embodiments.

Integrated circuit 600C is an embodiment of integrated circuit 200B of FIG. 2B, and similar detailed description is therefore omitted.

Integrated circuit 600C illustrates an example of PMOS transistor M1 positioned in well 320a, PMOS transistor M3 is positioned in well 520a, PMOS transistor M2 is positioned in well 420b, and PMOS transistors M4, M5 and M6 are positioned in a well 620a, and similar detailed description is therefore omitted. In some embodiments, each of wells 320a, 420b, 520a and 620a are separated from each other in the first direction X and are thus different.

Integrated circuit 600C comprises substrate 102, wells 320a, 420b, 520a and 620a, regions 304a, 404d, 504b and 604c, gates 106a, 106b, 106c, 106d, 206e and 206f, implant regions 308a, 408d, 508b, 608c, 608e and 608f, and implant regions 310a, 410d, 510b, 610c, 610e and 610f.

In comparison with integrated circuit 200B of FIG. 2B, well 320a replaces well NW4, well 420b replaces well NW1, well 520a replaces well NW3, and well 620a replaces wells NW5, NW6 and NW2 of FIG. 2B, and similar detailed description is therefore omitted.

In other words, wells NW5, NW6 and NW2 of FIG. 2B are merged into well 620a, and similar detailed description is therefore omitted. Each of well 320a, 420b, 520a and 620a are separated from each other in the first direction X. In some embodiments, at least well 320a, 420b, 520a or 620a is different from another of at least well 320a, 420b, 520a or 620a.

Gate 106a is above well 320a, gate 106b is above well 520a, gates 106c, 206e and 206f are above well 620a, and gate 106d is above well 420b. For ease of illustration, gates 106a, 106b and 206e are not shown as being coupled to each other or other elements, and gates 106c, 106d and 206f are not shown as being coupled to each other or other elements.

In comparison with integrated circuit 200B of FIG. 2B, region 304a replaces region 104a, region 504b replaces region 104b of FIG. 2B, region 604c replaces regions 104c, 204e and 204f of FIG. 2B, and region 404d replaces region 104d of FIG. 2B, and similar detailed description is therefore omitted.

Stated differently, regions 104c, 204e and 204f of FIG. 2B are merged into region 604c, and similar detailed description is therefore omitted. Region 304a is within well 320a, region 504b is within well 520a, region 404d is within well 420b, and region 604c is within well 620a.

Integrated circuit 600C is a variation of integrated circuit 500C of FIG. 5C and integrated circuit 400C of FIG. 4C, and similar detailed description is therefore omitted. In comparison with integrated circuit 500C of FIG. 5C, implant regions 608e, 608f and 608c replace corresponding implant regions 508e, 508f and 508c, and implant regions 610e, 610f and 610c replace corresponding implant regions 510e, 510f and 510c, and similar detailed description is therefore omitted.

Implant regions 308a and 310a are described in FIG. 3C, and similar detailed description is therefore omitted. Implant regions 508b and 510b are described in FIG. 5C, and similar detailed description is therefore omitted.

Integrated circuit 600C is a variation of integrated circuit 400C of FIG. 4C, and similar detailed description is therefore omitted. For example, implant regions 408d and 410d described in FIG. 4C, and similar detailed description is therefore omitted.

In comparison with integrated circuit 200B of FIG. 2B, implant regions 608e, 608f and 608c replace corresponding implant regions 108e, 108f and 108c, and implant regions 610e, 610f and 610c replace corresponding implant regions 110e, 110f and 110c, and similar detailed description is therefore omitted.

Implant regions 308a and 310a are within well 320a. Implant regions 508b and 510b are within well 520a. Implant region 408d and implant region 410d are within well 420b. Implant regions 608c, 608e and 608f and implant regions 610c, 610e and 610f are within well 520b.

Each of region 604c, implant region 610e and implant region 608f are electrically coupled together at node F1, and corresponds to the connection between the body terminal of PMOS transistor M5, the drain terminal of PMOS transistor M5, the drain terminal of PMOS transistor M6, the body terminal of PMOS transistor M6, and the body terminal of PMOS transistor M4 at node F1.

Each of region 504b, implant region 510b and implant region 608e are electrically coupled together at node F2', and corresponds to the connection between the body terminal of PMOS transistor M3, the drain terminal of PMOS transistor M3 and the source terminal of PMOS transistor M5 of FIG. 6A.

Implant region 404d is electrically coupled to node F2 and corresponds to the connection between the body terminal of PMOS transistor M2 and node F2 of FIG. 6A.

Implant region 610f is electrically coupled to implant region 608c and corresponds to the connection between the source terminal of PMOS transistor M6 and the drain terminal of PMOS transistor M4 of FIG. 6A.

Implant region 610c is electrically coupled to implant region 408d and corresponds to the connection between the source terminal of PMOS transistor M4 and the drain terminal of PMOS transistor M2 of FIG. 6A.

Implant region 410d is electrically coupled to the pad terminal PAD and corresponds to the connection between the source terminal of PMOS transistor M2 and the pad terminal PAD of FIG. 5A.

Integrated circuit 600C includes parasitic diode D1 of FIG. 3C, a parasitic transistor Q2''', parasitic transistor Q3 of FIG. 3C, parasitic transistor Q4 of FIG. 4C, and a parasitic transistor Q5'.

Parasitic diode D1 is described in FIG. 3C, and parasitic transistor Q3 is described in FIGS. 3C and 5C, parasitic transistor Q4 is described in FIG. 4C, and similar detailed description is therefore omitted.

In comparison with integrated circuit 200B of FIG. 2B, parasitic transistor Q2''' replaces parasitic pnp transistors 212f and 112c of FIG. 2B, and similar detailed description is therefore omitted.

In comparison with integrated circuit 500C of FIG. 5C, parasitic transistor Q5' replaces parasitic transistor Q5 of FIG. 5C, and similar detailed description is therefore omitted.

Parasitic transistor Q5' is formed by well 620a, implant region 608e and implant region 610e. For example, the well 620a forms a base of parasitic transistor Q5', the implant region 608e forms an emitter of parasitic transistor Q5' and region 610e forms a collector of parasitic transistor Q5'.

Parasitic transistor Q2''' is formed by well 620a, implant region 608f and implant region 610c. For example, the well 620a forms a base of parasitic transistor Q2''', the implant region 610c forms an emitter of parasitic transistor Q2''' and region 608f forms a collector of parasitic transistor Q2'''.

In some embodiments, by positioning PMOS transistor M1 in well 320a, by positioning PMOS transistor M3 in a separate well (well 520a), by positioning PMOS transistors M5, M6 and M4 in another separate well (well 620a), and by positioning PMOS transistor M2 in yet another separate well (well 420b), a parasitic current path of integrated circuit 600C includes parasitic elements (e.g., parasitic diode D1, parasitic transistor Q3 and parasitic transistor Q5') positioned in different wells (320a, 520a and 620a), and another parasitic current path of integrated circuit 600C includes parasitic elements (e.g., parasitic transistor Q2''' and parasitic transistor Q4) positioned in different wells (620a and 420b), thereby improving the ESD immunity of integrated circuit 600A-600C compared to other approaches, and integrated circuit 600A-600C occupies less area than other approaches with similar performance.

Figures 7A, 7B:
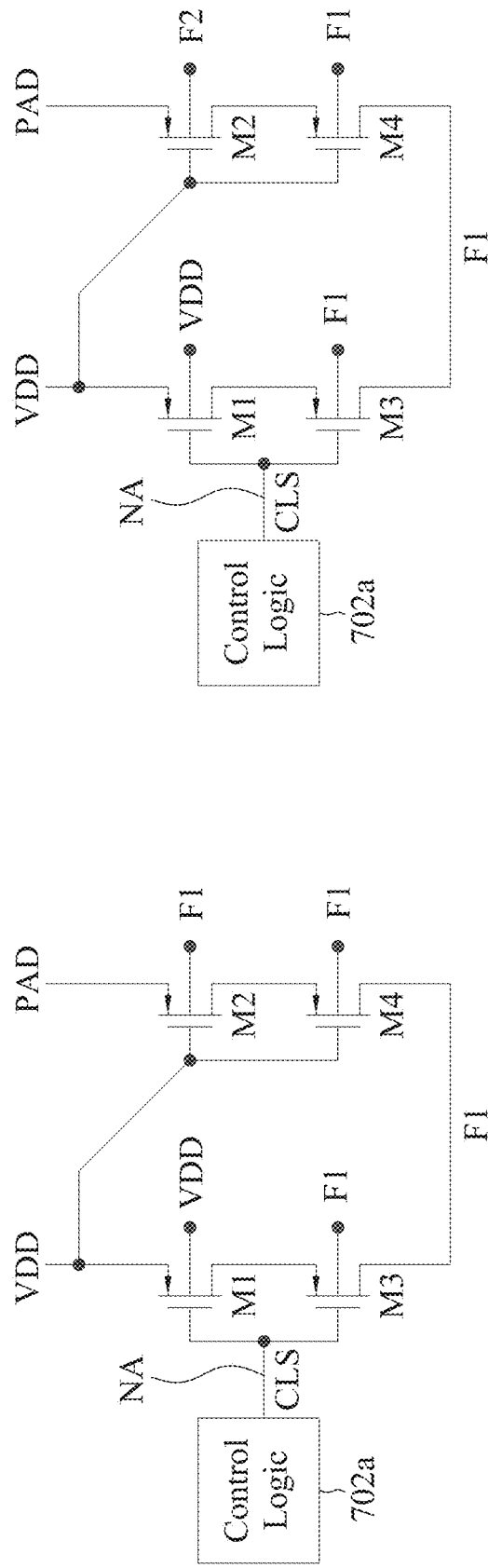
FIG. 7A is a circuit diagram of an integrated circuit, in accordance with some embodiments.
FIG. 7B is a circuit diagram of an integrated circuit, in accordance with some embodiments.

FIG. 7A is a circuit diagram of an integrated circuit 700A, in accordance with some embodiments.

Integrated circuit 700A is an embodiment of integrated circuit 100A of FIG. 1A. Integrated circuit 700A is a variation of integrated circuit 300A of FIG. 3A, and similar detailed description is therefore omitted. In comparison with integrated circuit 300A of FIG. 3A, integrated circuit 700A further comprises a control logic circuit 702a.

Control logic circuit 702a is configured to generate a control logic signal CLS. In some embodiments, the control logic signal CLS is similar to the voltage of the pad terminal PAD, and similar detailed description is therefore omitted.

In comparison with integrated circuit 300A of FIG. 3A, each of the gate terminal of PMOS transistor M3 and the gate terminal of PMOS transistor M1 are not coupled to the source terminal of PMOS transistor M2 and the pad terminal PAD.

In FIGS. 7A-7B, the gate terminal of PMOS transistor M3 and the gate terminal of PMOS transistor M1 are coupled to the control logic circuit 702a, and are configured to receive a control logic signal CLS from the control logic circuit 702a.

In some embodiments, the control logic signal CLS is equal to a logic 0 corresponding to a reference supply voltage VSS. In some embodiments, the control logic signal CLS is equal to a logic 1 corresponding to the voltage of the pad terminal PAD (e.g., the PAD voltage).

FIG. 7B is a circuit diagram of an integrated circuit 700B, in accordance with some embodiments.

Integrated circuit 700B is an embodiment of integrated circuit 100A of FIG. 1A. Integrated circuit 700B is a variation of integrated circuit 400A of FIG. 4A, and similar detailed description is therefore omitted. In comparison with integrated circuit 400A of FIG. 4A, integrated circuit 700B further comprises control logic circuit 702a. The control logic circuit 702a of FIG. 7B was described in FIG. 7A, and similar detailed description is therefore omitted.

In comparison with integrated circuit 400A of FIG. 4A, each of the gate terminal of PMOS transistor M3 and the gate terminal of PMOS transistor M1 are not coupled to the source terminal of PMOS transistor M2 and the pad terminal PAD.

In FIG. 7B, the gate terminal of PMOS transistor M3 and the gate terminal of PMOS transistor M1 are coupled to the control logic circuit 702a, and are configured to receive a control logic signal CLS from the control logic circuit 702a.

Figures 7C, 7D:
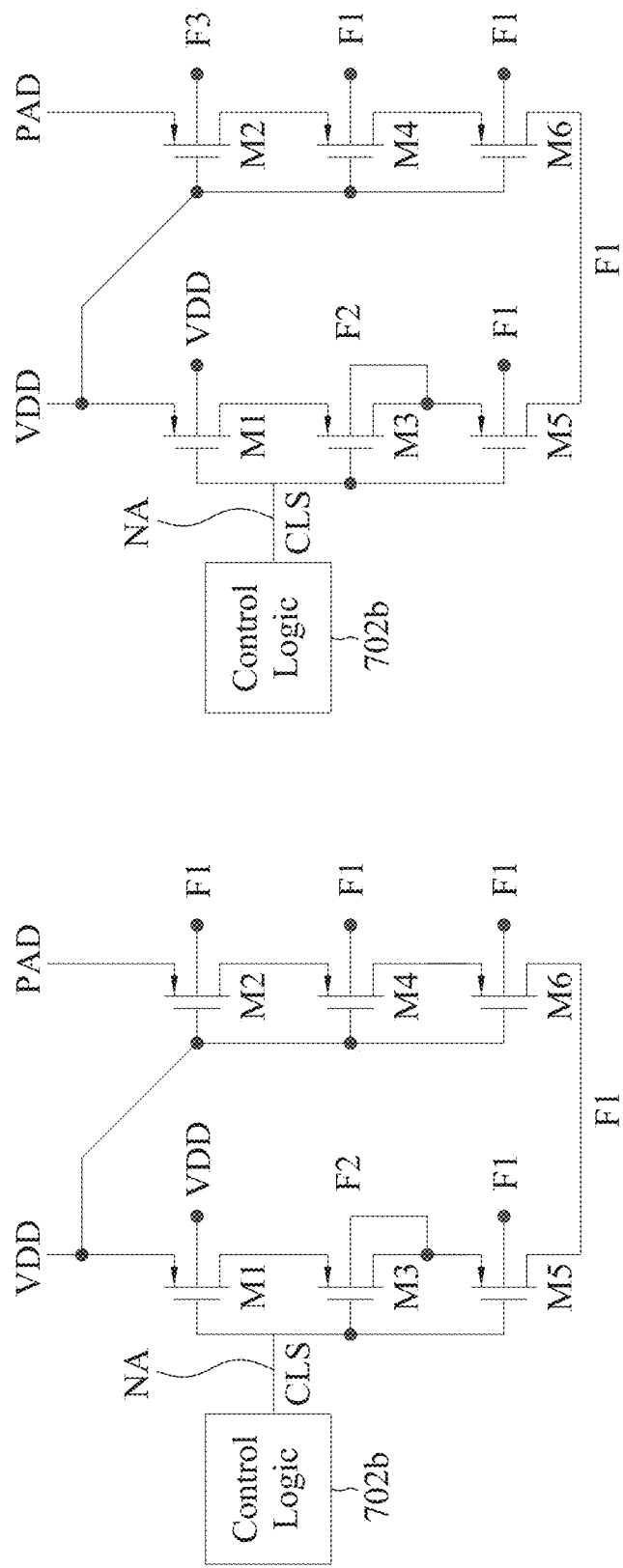
FIG. 7C is a circuit diagram of an integrated circuit, in accordance with some embodiments.
FIG. 7D is a circuit diagram of an integrated circuit, in accordance with some embodiments.

FIG. 7C is a circuit diagram of an integrated circuit 700C, in accordance with some embodiments.

Integrated circuit 700C is an embodiment of integrated circuit 200A of FIG. 2A. Integrated circuit 700C is a variation of integrated circuit 500A of FIG. 5A, and similar detailed description is therefore omitted. In comparison with integrated circuit 500A of FIG. 5A, integrated circuit 700C further comprises a control logic circuit 702b.

Control logic circuit 702b of FIGS. 7C-7D is similar to control logic circuit 702a described in FIGS. 7A-7B, and similar detailed description is therefore omitted.

In comparison with integrated circuit 500A of FIG. 5A, each of the gate terminal of PMOS transistor M3, the gate terminal of PMOS transistor M1 and the gate terminal of PMOS transistor M5 are not coupled to the source terminal of PMOS transistor M2 and the pad terminal PAD.

In FIGS. 7C-7D, the gate terminal of PMOS transistor M3, the gate terminal of PMOS transistor M1 and the gate terminal of PMOS transistor M5 are coupled to the control logic circuit 702b, and are configured to receive control logic signal CLS from the control logic circuit 702b.

FIG. 7D is a circuit diagram of an integrated circuit 700D, in accordance with some embodiments.

Integrated circuit 700D is an embodiment of integrated circuit 200A of FIG. 2A. Integrated circuit 700D is a variation of integrated circuit 600A of FIG. 6A, and similar detailed description is therefore omitted. In comparison with integrated circuit 600A of FIG. 6A, integrated circuit 700D further comprises control logic circuit 702b.

Control logic circuit 702b of FIG. 7D is similar to control logic circuit 702a described in FIGS. 7A-7B, and similar detailed description is therefore omitted.

In comparison with integrated circuit 600A of FIG. 6A, each of the gate terminal of PMOS transistor M3, the gate terminal of PMOS transistor M1 and the gate terminal of PMOS transistor M5 are not coupled to the source terminal of PMOS transistor M2 and the pad terminal PAD.

In FIG. 7D, the gate terminal of PMOS transistor M3, the gate terminal of PMOS transistor M1 and the gate terminal of PMOS transistor M5 are coupled to the control logic circuit 702b, and are configured to receive control logic signal CLS from the control logic circuit 702b.

Figure 8:
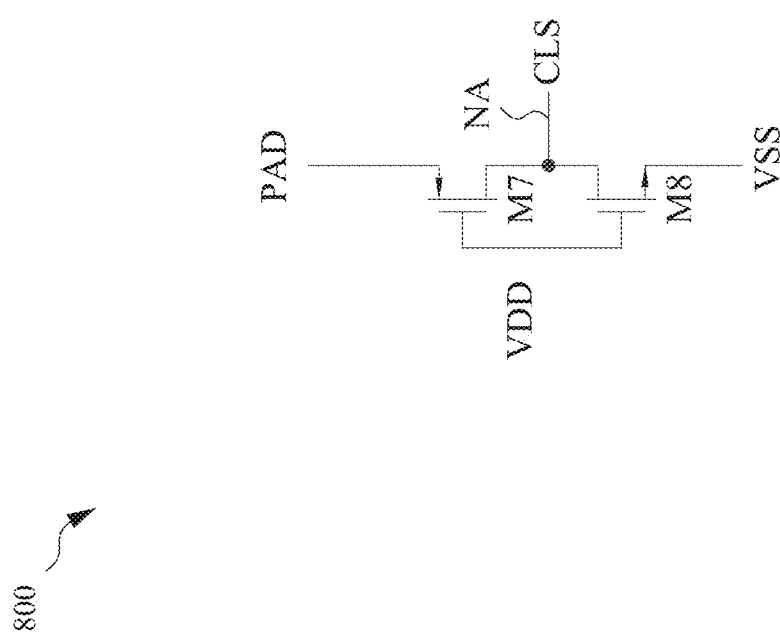
FIG. 8 is a circuit diagram of a control logic circuit, in accordance with some embodiments.

FIG. 8 is a circuit diagram of a control logic circuit 800, in accordance with some embodiments.

Control logic circuit 800 is an embodiment of at least control logic circuit 700A of FIG. 7A, control logic circuit 700B of FIG. 7B, control logic circuit 700C of FIG. 7C or control logic circuit 700D of FIG. 7D.

Control logic circuit 800 includes a PMOS transistor M7 and a NMOS transistor M8 coupled to voltage supply VDD, pad terminal PAD, reference voltage supply VSS and a node NA. In some embodiments, control logic circuit 800 is an inverter. Other circuits are within the scope of the present disclosure.

A source terminal of PMOS transistor M7 is coupled to at least the pad terminal PAD and is configured to receive a pad voltage (not labelled). Each of a gate terminal of PMOS transistor M7 and a gate terminal of NMOS transistor M8 is coupled together. The gate terminal of PMOS transistor M7 and NMOS transistor M8 are further coupled to at least the voltage supply VDD, and are configured to receive the supply voltage (not labelled). A drain terminal of PMOS transistor M7 is coupled to a drain terminal of NMOS transistor M8 at node NA. A source terminal of PMOS transistor M8 is coupled to reference voltage supply VSS.

In some embodiments, when the voltage of the pad terminal PAD is greater than a voltage of the supply voltage VDD, then PMOS transistor M7 is turned on and pulls node NA to the voltage of the pad terminal PAD thereby causing the voltage of node NA to be equal to the voltage of the pad terminal PAD, and the control logic signal CLS is equal to a logic 1. In some embodiments, when the voltage of the pad terminal PAD is less than a voltage of the supply voltage VDD, then NMOS transistor M8 is turned on and pulls node NA to the voltage of the reference supply voltage VSS thereby causing the voltage of node NA to be equal to the voltage of the reference supply voltage VSS, and the control logic signal CLS is equal to a logic 0.

Method

Figure 9:
FIG. 9 is a flowchart of a method of operating a circuit, such as the integrated circuit of FIG. 1A-1B, 2A-2B, 3A-3C, 4A-4C, 5A-5C, 6A-6C, 7A-7D or 8, in accordance with some embodiments.

FIG. 9 is a flowchart of a method of operating a circuit, such as the integrated circuit of FIG. 1A-1B, 2A-2B, 3A-3C, 4A-4C, 5A-5C, 6A-6C, 7A-7D or 8, in accordance with some embodiments. It is understood that additional operations may be performed before, during, and/or after the method 900 depicted in FIG. 9, and that some other processes may only be briefly described herein. It is understood that method 900 utilizes features of one or more of integrated circuits 100A-100B of FIGS. 1A-1B, 200A-200B of FIGS. 2A-2B, 300A-300C of FIGS. 3A-3C, 400A-400C of FIGS. 4A-4C, 500A-500C of FIGS. 5A-5C, 600A-600C of FIGS. 6A-6C, 700A-700C of FIGS. 7A-7D or 800 of FIG. 8.

In operation 902 of method 900, a pad voltage is received on a pad voltage terminal PAD. In some embodiments, the pad voltage is greater than a supply voltage of a voltage supply VDD. In some embodiments, if the pad voltage is greater than the supply voltage of the voltage supply VDD, then method 900 proceeds to operation 904.

In some embodiments, the pad voltage is less than the supply voltage of a voltage supply VDD. In some embodiments, if the pad voltage is less than the supply voltage of the voltage supply VDD, then method 900 proceeds to operation 912.

In operation 904 of method 900, at least a first set of transistors M2 coupled to the pad voltage terminal are turned on in response to the pad voltage being greater than the supply voltage of the voltage supply VDD, and at least a second set of transistors coupled to the first voltage supply are turned off in response to the pad voltage being greater than the supply voltage of the voltage supply VDD. In some embodiments, the first set of transistors includes at least PMOS transistor M1, M3 or M5. In some embodiments, the second set of transistors includes at least PMOS transistor M2, M4 or M6. In some embodiments, a first transistor of the first set of transistors is in a first well, and a second transistor of the second set of transistors is in a second well different from the first well. In some embodiments, the first well includes at least a well described in FIGS. 1A-8, the second well includes at least another well described in FIGS. 1A-8.

In some embodiments, operation 904 comprises one or more of operations 906, 908 or 910.

In operation 906 of method 900, a first node F1 is electrically coupled with the pad voltage terminal by the first set of transistors.

In operation 908 of method 900, the first node F1 is electrically decoupled from the first voltage supply by the second set of transistors.

In operation 910 of method 900, the pad voltage is placed across the second set of transistors.

In operation 912 of method 900, at least the first set of transistors M2 coupled to the pad voltage terminal are turned off in response to the pad voltage being less than the supply voltage of the voltage supply VDD, and at least the second set of transistors coupled to the first voltage supply are turned on in response to the pad voltage being less than the supply voltage of the voltage supply VDD.

In some embodiments, operation 912 comprises one or more of operations 914, 916 or 918.

In operation 914 of method 900, the first node F1 is electrically decoupled from the pad voltage terminal by the first set of transistors.

In operation 916 of method 900, the first node F1 is electrically coupled with the first voltage supply by the second set of transistors.

In operation 918 of method 900, the pad voltage is placed across the first set of transistors.

In some embodiments, one or more of the operations of method 900 is not performed. While method 900 was described above with reference to FIGS. 3A-3C, it is understood that method 900 utilizes the features of one or more of FIGS. 1A-2B & 4A-8. In these embodiments, other operations of method 900 would be performed consistent with the description and operation of integrated circuits 100A-200B & 400A-800 of FIGS. 1A-2B & 4A-8.

Furthermore, various PMOS transistors shown in FIGS. 1A-8 are of a particular dopant type (e.g., N-type or P-type) and are for illustration purposes. Embodiments of the disclosure are not limited to a particular transistor type, and one or more of the PMOS or NMOS transistors shown in FIGS. 1A-8 can be substituted with a corresponding transistor of a different transistor/dopant type. Similarly, the low or high logical value of various signals used in the above description is also used for illustration. Embodiments of the disclosure are not limited to a particular logical value when a signal is activated and/or deactivated. Selecting different logical values is within the scope of various embodiments. Selecting different numbers of PMOS transistors in 1A-8 is within the scope of various embodiments.

One aspect of this description relates to a voltage tracking circuit. The voltage tracking circuit includes a first transistor in a first well, the first transistor including a first gate terminal, a first drain terminal and a first source terminal, the first source terminal being coupled to a first voltage supply, the first gate terminal being coupled to a pad voltage terminal and configured to receive a pad voltage. In some embodiments, the voltage tracking circuit further includes a second transistor including a second gate terminal, a second drain terminal and a second source terminal, the second source terminal being coupled to the first drain terminal, the second gate terminal being coupled to the first gate terminal and the pad voltage terminal. In some embodiments, the voltage tracking circuit further includes a third transistor including a third gate terminal, a third drain terminal and a third source terminal, the third gate terminal being coupled to the first voltage supply. In some embodiments, the voltage tracking circuit further includes a fourth transistor in a second well different from the first well, and being separated from the first well in a first direction, the fourth transistor including a fourth gate terminal, a fourth drain terminal and a fourth source terminal, the fourth drain terminal being coupled to the third source terminal, the fourth gate terminal being coupled to the third gate terminal and the first voltage supply, and the fourth source terminal being coupled to the pad voltage terminal. In some embodiments, at least the second transistor or the third transistor is in a third well different from the first well and the second well, and being separated from the first well in the first direction.

Another aspect of this description relates to a voltage tracking circuit. The voltage tracking circuit includes a control logic circuit, and a first transistor in a first well, the first transistor including a first gate terminal, a first drain terminal and a first source terminal, the first source terminal being coupled to a first voltage supply, the first gate terminal being coupled to the control logic circuit and configured to receive a control logic signal. In some embodiments, the voltage tracking circuit further includes a second transistor including a second gate terminal, a second drain terminal and a second source terminal, the second source terminal being coupled to the first drain terminal, the second gate terminal being coupled to the first gate terminal and the control logic circuit, and configured to receive the control logic signal. In some embodiments, the voltage tracking circuit further includes a third transistor including a third gate terminal, a third drain terminal and a third source terminal, the third gate terminal being coupled to the first voltage supply. In some embodiments, the voltage tracking circuit further includes a fourth transistor in a second well different from the first well, and being separated from the first well in a first direction, the fourth transistor including a fourth gate terminal, a fourth drain terminal and a fourth source terminal, the fourth drain terminal being coupled to the third source terminal, the fourth gate terminal being coupled to the third gate terminal and the first voltage supply, and the fourth source terminal being coupled to a pad voltage terminal. In some embodiments, at least the second transistor or the third transistor is in a third well different from the first well and the second well, and being separated from the first well in the first direction.

Yet another aspect of this description relates to a method of operating a pad voltage tracking circuit. The method includes receiving a pad voltage on a pad voltage terminal, the pad voltage being less than a supply voltage of a first voltage supply. In some embodiments, the method further includes turning off at least a first set of transistors coupled to the pad voltage terminal, and turning on a second set of transistors coupled to the first voltage supply, a first transistor of the first set of transistors being in a first well, and a second transistor of the second set of transistors being in a second well different from the first well. In some embodiments, the method further includes electrically decoupling a first node from the pad voltage terminal by the first set of transistors. In some embodiments, the method further includes electrically coupling the first node with the first voltage supply by the second set of transistors. In some embodiments, the method further includes placing the pad voltage across the first set of transistors.

A number of embodiments have been described. It will nevertheless be understood that various modifications may be made without departing from the spirit and scope of the disclosure. For example, various transistors being shown as a particular dopant type (e.g., N-type or P-type Metal Oxide Semiconductor (NMOS or PMOS)) are for illustration purposes. Embodiments of the disclosure are not limited to a particular type. Selecting different dopant types for a particular transistor is within the scope of various embodiments. The low or high logical value of various signals used in the above description is also for illustration. Various embodiments are not limited to a particular logical value when a signal is activated and/or deactivated. Selecting different logical values is within the scope of various embodiments. In various embodiments, a transistor functions as a switch. A switching circuit used in place of a transistor is within the scope of various embodiments. In various embodiments, a source of a transistor can be configured as a drain, and a drain can be configured as a source. As such, the term source and drain are used interchangeably. Various signals are generated by corresponding circuits, but, for simplicity, the circuits are not shown.

Various figures show capacitive circuits using discrete capacitors for illustration. Equivalent circuitry may be used. For example, a capacitive device, circuitry or network (e.g., a combination of capacitors, capacitive elements, devices, circuitry, or the like) can be used in place of the discrete capacitor. The above illustrations include exemplary steps, but the steps are not necessarily performed in the order shown. Steps may be added, replaced, changed order, and/or eliminated as appropriate, in accordance with the spirit and scope of disclosed embodiments.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A voltage tracking circuit comprising:
a first transistor in a first well, the first transistor including a first gate terminal, a first drain terminal and a first source terminal, the first source terminal being coupled to a first voltage supply, the first gate terminal being coupled to a pad voltage terminal and configured to receive a pad voltage;
a second transistor including a second gate terminal, a second drain terminal and a second source terminal, the second source terminal being coupled to the first drain terminal, the second gate terminal being coupled to the first gate terminal and the pad voltage terminal;
a third transistor including a third gate terminal, a third drain terminal and a third source terminal, the third gate terminal being coupled to the first voltage supply; and
a fourth transistor in a second well different from the first well, and being separated from the first well in a first direction, the fourth transistor including a fourth gate terminal, a fourth drain terminal and a fourth source terminal, the fourth drain terminal being coupled to the third source terminal, the fourth gate terminal being coupled to the third gate terminal and the first voltage supply, and the fourth source terminal being coupled to the pad voltage terminal,
wherein at least the second transistor or the third transistor is in a third well different from the first well and the second well, and being separated from the first well in the first direction.

2. The voltage tracking circuit of claim 1, wherein the first transistor further includes a first body terminal coupled to the first voltage supply, the first source terminal, the third gate terminal and the fourth gate terminal.

3. The voltage tracking circuit of claim 2, wherein
the second transistor further includes a second body terminal;
the third transistor further includes a third body terminal coupled to the second body terminal; and
the fourth transistor further includes a fourth body terminal coupled to a node.

4. The voltage tracking circuit of claim 3, wherein
the second drain terminal and the third drain terminal are coupled together; and
the second body terminal and the third body terminal are further coupled to each of the second drain terminal and the third drain terminal.

5. The voltage tracking circuit of claim 4, wherein
the second transistor and the third transistor are in the third well.

6. The voltage tracking circuit of claim 1, further comprising:
a fifth transistor including a fifth gate terminal, a fifth drain terminal and a fifth source terminal, the fifth source terminal being coupled to the second drain terminal, the fifth gate terminal being coupled to the first gate terminal, the second gate terminal and the pad voltage terminal; and
a sixth transistor including a sixth gate terminal, a sixth drain terminal and a sixth source terminal, the sixth source terminal being coupled to the third drain terminal, the sixth gate terminal being coupled to the third gate terminal, the fourth gate terminal and the first voltage supply, and the sixth drain terminal being coupled to the fifth drain terminal.

7. The voltage tracking circuit of claim 6, wherein
the fifth transistor and the sixth transistor are in the second well; and
the second transistor is in the third well.

8. The voltage tracking circuit of claim 7, wherein
the first transistor further includes a first body terminal coupled to the first voltage supply, the first source terminal, the third gate terminal and the fourth gate terminal;
the second transistor further includes a second body terminal;
the third transistor further includes a third body terminal;
the fourth transistor further includes a fourth body terminal;
the fifth transistor further includes a fifth body terminal;
the sixth transistor further includes a sixth body terminal;
each of the third body terminal, the fourth body terminal, the fifth body terminal, the sixth body terminal, the fifth drain terminal and the sixth drain terminal are coupled together; and
each of the second body terminal the second drain terminal and the fifth source terminal are coupled together.

9. The voltage tracking circuit of claim 7, wherein the third well is between the first well and the second well.

10. A voltage tracking circuit comprising:
a control logic circuit;
a first transistor in a first well, the first transistor including a first gate terminal, a first drain terminal and a first source terminal, the first source terminal being coupled to a first voltage supply, the first gate terminal being coupled to the control logic circuit and configured to receive a control logic signal;
a second transistor including a second gate terminal, a second drain terminal and a second source terminal, the second source terminal being coupled to the first drain terminal, the second gate terminal being coupled to the first gate terminal and the control logic circuit, and configured to receive the control logic signal;
a third transistor including a third gate terminal, a third drain terminal and a third source terminal, the third gate terminal being coupled to the first voltage supply; and
a fourth transistor in a second well different from the first well, and being separated from the first well in a first direction, the fourth transistor including a fourth gate terminal, a fourth drain terminal and a fourth source terminal, the fourth drain terminal being coupled to the third source terminal, the fourth gate terminal being coupled to the third gate terminal and the first voltage supply, and the fourth source terminal being coupled to a pad voltage terminal,
wherein at least the second transistor or the third transistor is in a third well different from the first well and the second well, and being separated from the first well in the first direction.

11. The voltage tracking circuit of claim 10, wherein the control logic circuit comprises an inverter configured to receive an inverted control logic signal and to generate the control logic signal.

12. The voltage tracking circuit of claim 10, wherein
the first transistor further includes a first body terminal coupled to the first voltage supply, the first source terminal, the third gate terminal and the fourth gate terminal;
the second transistor further includes a second body terminal;
the third transistor further includes a third body terminal;
the fourth transistor further includes a fourth body terminal coupled to a node; and
each of the second body terminal, the third body terminal, the second drain terminal and the third drain terminal are coupled together.

13. The voltage tracking circuit of claim 10, wherein
the second transistor and the third transistor are in the third well.

14. The voltage tracking circuit of claim 10, further comprising:
a fifth transistor including a fifth gate terminal, a fifth drain terminal and a fifth source terminal, the fifth source terminal being coupled to the second drain terminal, the fifth gate terminal being coupled to the first gate terminal, the second gate terminal and the control logic circuit, and configured to receive the control logic signal; and
a sixth transistor including a sixth gate terminal, a sixth drain terminal and a sixth source terminal, the sixth source terminal being coupled to the third drain terminal, the sixth gate terminal being coupled to the third gate terminal, the fourth gate terminal and the first voltage supply, and the sixth drain terminal being coupled to the fifth drain terminal.

15. The voltage tracking circuit of claim 14, wherein
the third transistor, the fifth transistor and the sixth transistor are in the second well; and
the second transistor is in the third well.

16. The voltage tracking circuit of claim 15, wherein
the first transistor further includes a first body terminal coupled to the first voltage supply, the first source terminal, the third gate terminal and the fourth gate terminal;
the second transistor further includes a second body terminal;
the third transistor further includes a third body terminal;

the fourth transistor further includes a fourth body terminal;

the fifth transistor further includes a fifth body terminal;

the sixth transistor further includes a sixth body terminal;

each of the third body terminal, the fourth body terminal, the fifth body terminal, the sixth body terminal, the fifth drain terminal and the sixth drain terminal are coupled together; and each of the second body terminal the second drain terminal and the fifth source terminal are coupled together.

17. The voltage tracking circuit of claim 14, wherein the third transistor, the fifth transistor and the sixth transistor are in a fourth well different from the first well, the second well and the third well, and is separated from the first well, the second well and the third well in the first direction.

18. The voltage tracking circuit of claim 17, wherein the second transistor is in the third well.

19. The voltage tracking circuit of claim 18, wherein the first transistor further includes a first body terminal coupled to the first voltage supply, the first source terminal, the third gate terminal and the fourth gate terminal;

the second transistor further includes a second body terminal;

the third transistor further includes a third body terminal;

the fourth transistor further includes a fourth body terminal coupled to a node;

the fifth transistor further includes a fifth body terminal;

the sixth transistor further includes a sixth body terminal;

each of the third body terminal, the fifth body terminal, the sixth body terminal, the fifth drain terminal and the sixth drain terminal are coupled together; and the second body terminal is coupled to the second drain terminal and the fifth source terminal.

20. A method of operating a pad voltage tracking circuit, comprising:

receiving a pad voltage on a pad voltage terminal, the pad voltage being less than a supply voltage of a first voltage supply;

turning off at least a first set of transistors coupled to the pad voltage terminal, and turning on a second set of transistors coupled to the first voltage supply, a first transistor of the first set of transistors being in a first well, and a second transistor of the second set of transistors being in a second well different from the first well;

electrically decoupling a first node from the pad voltage terminal by the first set of transistors;

electrically coupling the first node with the first voltage supply by the second set of transistors; and placing the pad voltage across the first set of transistors.

* * * * *